(12) United States Patent
Tsuboi

(10) Patent No.: US 9,838,636 B2
(45) Date of Patent: Dec. 5, 2017

(54) IMAGE PICKUP APPARATUS, IMAGE PICKUP SYSTEM, AND METHOD OF DRIVING IMAGE PICKUP APPARATUS

(71) Applicant: CANON KABUSHIKI KAISHA, Tokyo (JP)

(72) Inventor: Hiromasa Tsuboi, Tama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/992,301

(22) Filed: Jan. 11, 2016

(65) Prior Publication Data

US 2016/0219238 A1 Jul. 28, 2016

(30) Foreign Application Priority Data

Jan. 23, 2015 (JP) .................................. 2015-010964

(51) Int. Cl.
*H04N 3/14* (2006.01)
*H04N 5/378* (2011.01)
(Continued)

(52) U.S. Cl.
CPC ....... *H04N 5/378* (2013.01); *H01L 27/14603* (2013.01); *H01L 27/14612* (2013.01);
(Continued)

(58) Field of Classification Search
CPC .. H04N 5/378; H04N 5/37457; H04N 5/3696; H04N 5/3745; H04N 5/37455;
(Continued)

(56) References Cited

U.S. PATENT DOCUMENTS 6,657,665 B1 * 12/2003 Guidash ............ H01L 27/14603
257/E27.131
7,749,831 B2 * 7/2010 Lyu ................... H01L 27/14603
257/E21.134
(Continued)

FOREIGN PATENT DOCUMENTS

JP 2013-106194 5/2013

*Primary Examiner* — Ngoc-Yen Vu
(74) *Attorney, Agent, or Firm* — Fitzpatrick, Cella, Harper & Scinto

(57) ABSTRACT

Provided is an image pickup apparatus, including: first and second photoelectric conversion elements; first and second transfer transistors configured to transfer charges respectively from the first and second photoelectric conversion elements when the first and second transfer transistors are brought into conductive states, respectively; a floating diffusion region configured to accumulate the charges transferred by the first and second transfer transistors; an amplifying transistor configured to output a signal corresponding to the charges transferred by the first and second transfer transistors; first and second drive wirings, which are electrically connected to gates of the first and second transfer transistors, respectively; and a conductive member, which is configured to electrically connect the floating diffusion region and a gate of the amplifying transistor to each other, and is configured to extend beyond the floating diffusion region in a plan view while being opposed to the first drive wiring.

19 Claims, 16 Drawing Sheets

(51) Int. Cl.
*H04N 5/3745* (2011.01)
*H04N 5/369* (2011.01)
*H01L 27/146* (2006.01)
*H04N 5/335* (2011.01)

(52) U.S. Cl.
CPC .. *H01L 27/14623* (2013.01); *H01L 27/14641* (2013.01); *H04N 5/3696* (2013.01); *H04N 5/37457* (2013.01)

(58) Field of Classification Search
CPC .............. H04N 5/376; H01L 27/14603; H01L 27/14612; H01L 27/14623; H01L 27/14641; H01L 27/14643; H01L 24/146
USPC .................................. 348/294, 302, 308–310
See application file for complete search history.

(56) References Cited

U.S. PATENT DOCUMENTS

| | | | |
|---|---|---|---|
| 8,928,791 B2 | 1/2015 | Okita et al. | |
| 9,443,893 B2* | 9/2016 | Yamazaki | H01L 27/14609 |
| 9,544,493 B2* | 1/2017 | Toyoguchi | H04N 5/3696 |
| 2014/0319321 A1* | 10/2014 | Wada | H04N 5/23212 |
| | | | 250/208.1 |
| 2014/0320690 A1* | 10/2014 | Kobayashi | H01L 27/14609 |
| | | | 348/222.1 |
| 2015/0325606 A1* | 11/2015 | Togashi et al. | H04N 5/361 |
| | | | 250/208.1 |

\* cited by examiner

IMAGE PICKUP APPARATUS, IMAGE PICKUP SYSTEM, AND METHOD OF DRIVING IMAGE PICKUP APPARATUS

BACKGROUND OF THE INVENTION

Field of the Invention

The present invention relates to an image pickup apparatus, an image pickup system, and a method of driving an image pickup apparatus.

Description of the Related Art

There has been proposed an image pickup apparatus of a pupil division system capable of performing both focus detection and image pickup. For example, in an image pickup apparatus disclosed in Japanese Patent Application Laid-Open No. 2013-106194, one pixel includes a photoelectric conversion element A and a photoelectric conversion element B, and a microlens is formed on an upper side of the photoelectric conversion element A and the photoelectric conversion element B. Further, a pupil of a photographing lens and the photoelectric conversion elements are arranged so as to have a substantially conjugate positional relationship. With such a configuration, while focus detection is performed based on signals of the photoelectric conversion element A and the photoelectric conversion element B, the signals of the photoelectric conversion element A and the photoelectric conversion element B are added, to thereby obtain a signal for forming an image. Further, in Japanese Patent Application Laid-Open No. 2013-106194, after the signal is read from the photoelectric conversion element A, the signal of the photoelectric conversion element B is added to the signal of the photoelectric conversion element A, to thereby read a signal for forming an image.

In the image pickup apparatus disclosed in the above-mentioned literature, an attempt has not been made to improve the transfer efficiency of a charge from a photoelectric conversion element to an amplification unit.

SUMMARY OF THE INVENTION

According to one embodiment of the present invention, there is provided an image pickup apparatus, including: a first photoelectric conversion element and a second photoelectric conversion element; a first transfer transistor and a second transfer transistor, which are configured to transfer charges respectively from the first photoelectric conversion element and the second photoelectric conversion element when the first transfer transistor and the second transfer transistor are brought into conductive states, respectively; a floating diffusion region configured to accumulate the charges transferred by the first transfer transistor and the second transfer transistor; an amplifying transistor configured to output a signal corresponding to the charges transferred by the first transfer transistor and the second transfer transistor; a first drive wiring and a second drive wiring, which are electrically connected to gates of the first transfer transistor and the second transfer transistor, respectively; a drive unit capable of performing a read mode of bringing the first transfer transistor into a conductive state by supplying a drive pulse to the first drive wiring and a read mode of bringing both the first transfer transistor and the second transfer transistor into a conductive state by supplying a drive pulse to the first drive wiring and the second drive wiring in parallel; and a conductive member, which is configured to electrically connect the floating diffusion region and a gate of the amplifying transistor to each other, and is configured to extend beyond an end portion of the floating diffusion region in a plan view while being opposed to the first drive wiring.

According to another embodiment of the present invention, there is provided a method of driving an image pickup apparatus, the image pickup apparatus including: a first photoelectric conversion element and a second photoelectric conversion element; a first transfer transistor and a second transfer transistor, which are configured to transfer charges respectively from the first photoelectric conversion element and the second photoelectric conversion element when the first transfer transistor and the second transfer transistor are brought into conductive states, respectively; a floating diffusion region configured to accumulate the charges transferred by the first transfer transistor and the second transfer transistor; an amplifying transistor configured to output a signal corresponding to the charges transferred by the first transfer transistor and the second transfer transistor; a first drive wiring and a second drive wiring which are electrically connected to gates of the first transfer transistor and the second transfer transistor; and a conductive member, which is configured to electrically connect the floating diffusion region and a gate of the amplifying transistor to each other, and is configured to extend beyond an end portion of the floating diffusion region in a plan view while being opposed to the first drive wiring, the method including: supplying a drive pulse to the first drive wiring and the second drive wiring in parallel to bring both the first transfer transistor and the second transfer transistor into a conductive state, to thereby read charges respectively from the first photoelectric conversion element and the second photoelectric conversion element in an added state; and supplying a drive pulse to only the first drive wiring to bring the first transfer transistor into a conductive state, to thereby read the charge from the first photoelectric conversion element.

According to the image pickup apparatus of the one embodiment of the present invention, the transfer efficiency of a charge from the photoelectric conversion element to the amplifying unit may be improved in a photoelectric conversion device capable of performing both focus detection and image formation.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
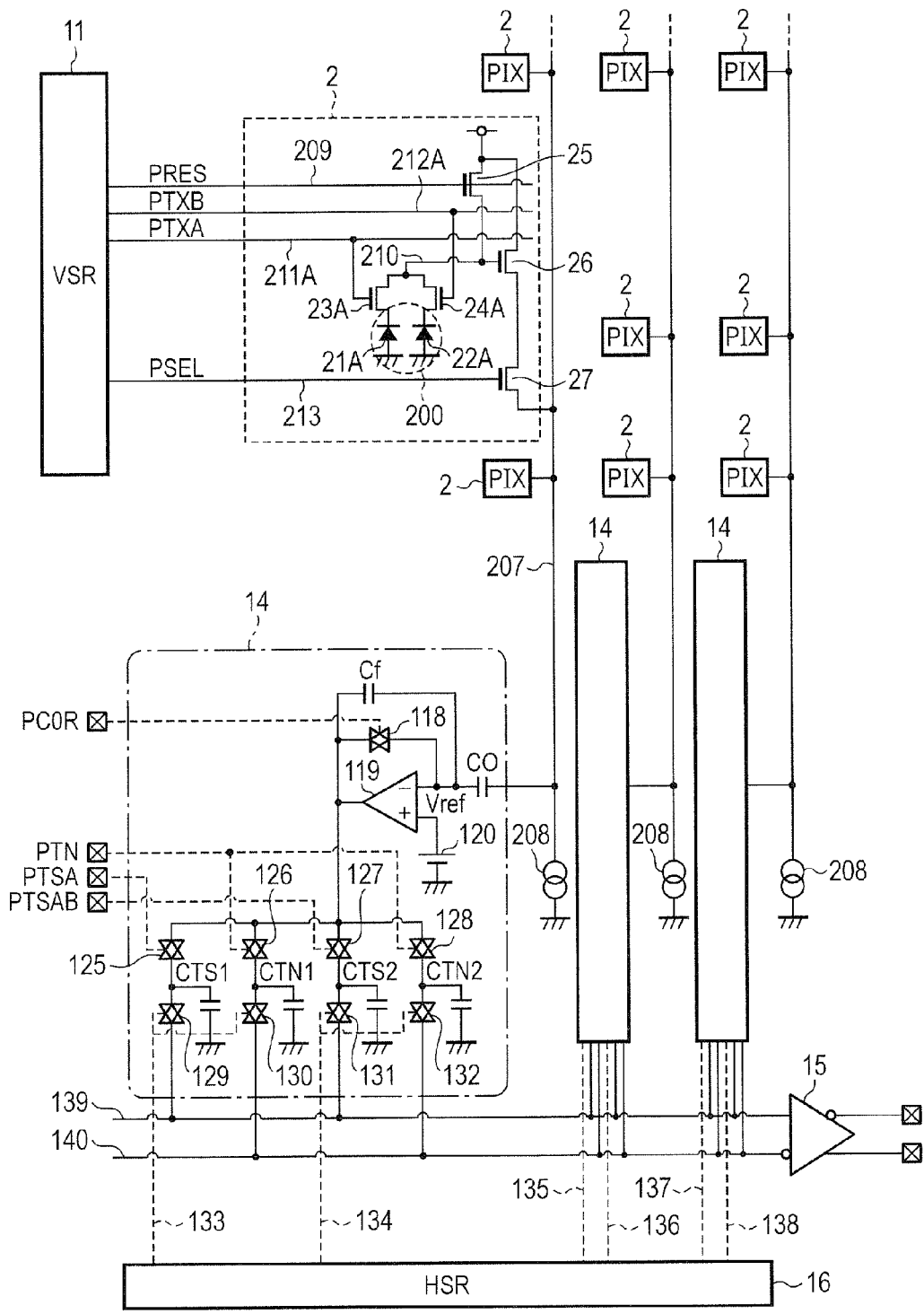
FIG. 1 is a circuit diagram of an image pickup apparatus according to a first embodiment of the present invention.

An image pickup apparatus according to a first embodiment of the present invention is described with reference to FIG. 1 to FIG. 9. FIG. 1 is a circuit diagram of the image pickup apparatus according to the first embodiment. The image pickup apparatus includes pixels 2, a vertical scanning circuit 11, current sources 208, column amplifying circuits 14, an output amplifier 15, and a horizontal scanning circuit 16. A plurality of pixels 2 are arranged in two-dimensional matrix along a row direction and a column direction. In the present specification, the row direction refers to a horizontal direction in the drawing sheet, and the column direction refers to a vertical direction in the drawing sheet. In FIG. 1, for simplicity of the description, the pixels in three rows and three columns are illustrated. However, there is no particular limitation on the number of the pixels. A part of the pixels may be shielded from light as an optical black (OB) pixel.

Each of the pixels 2 includes a first photoelectric conversion element 21A, a second photoelectric conversion element 22A, a first transfer transistor 23A, a second transfer transistor 24A, a reset transistor 25, an amplifying transistor 26, and a selection transistor 27. The first photoelectric conversion element 21A and the second photoelectric conversion element 22A are formed of photodiodes. In the following description, an example is shown in which transistors forming the pixel 2 are N-channel MOS transistors. A microlens is arranged on the photoelectric conversion elements 21A and 22A, and light collected by the microlens enters the photoelectric conversion elements 21A and 22A.

The two photoelectric conversion elements 21A and 22A form one photoelectric conversion unit 200. The number of the photoelectric converts forming the photoelectric conversion unit 200 is not limited to two and may be two or more.

The transfer transistors 23A and 24A are arranged so as to correspond to the photoelectric conversion elements 21A and 22A, and drive wirings 211A and 212A are electrically connected to gates of the transfer transistors 23A and 24A, respectively. When the drive pulses of the drive wirings 211A and 212A become a high level, the transfer transistors 23A and 24A are turned on (brought into a conductive state), and signals of the photoelectric conversion elements 21A and 22A are transferred to a floating diffusion (FD) region 210 serving as an input node of the amplifying transistor 26. Further, when the drive pulses become a low level, the transfer transistors 23A and 24A are turned off (brought into a non-conductive state). The amplifying transistor 26 amplifies the signals transferred to the FD region 210 and outputs the signals to an output line 207.

A source of the reset transistor 25 is connected to the input node of the amplifying transistor 26, and a gate thereof is connected to a drive wiring 209. When the drive pulse of the drive wiring 209 becomes a high level, the reset transistor 25 is turned on, and a reset voltage is supplied to the input node of the amplifying transistor 26. With this, a charge of the input node is reset. The selection transistor 27 is arranged between the amplifying transistor 26 and the output line 207, and a drive wiring 213 is connected to a gate of the selection transistor 27. When the drive pulse of the drive wiring 213 becomes a high level, the amplifying transistor 26 and the output line 207 are electrically conducted.

The output line 207 is arranged for each column, and the current source 208 is electrically connected to the output line 207. The current source 208 supplies a bias current to a source of the amplifying transistor 26 through the output line 207, and the amplifying transistor 26 is operated as a source follower.

The vertical scanning circuit 11 serving as a drive unit supplies a drive pulse to each gate of the transfer transistors 23A and 24A, the reset transistor 25, and the selection transistor 27 in each row through the drive wirings 211A, 212A, 209, and 213. The drive pulse is supplied sequentially or randomly for each row. The vertical scanning circuit 11 can perform a read mode of bringing the transfer transistor 23A into a conductive state by supplying a drive pulse to the drive wiring 211A and a read mode of bringing both the transfer transistors 23A and 24A into a conductive state by supplying a drive pulse to the drive wirings 211A and 211B in parallel (see FIG. 2).

The column amplifying circuit 14 is arranged for each column and is connected to the output line 207 directly or through a switch. The column amplifying circuit 14 includes an operational amplifier 119, a reference voltage source 120, an input capacitor C0, a feedback capacitor Cf, hold capacitors CTS1, CTS2, CTN1, and CTN2, and switches 118 and 125 to 132.

A first node of the input capacitor C0 is electrically connected to the output line 207, and a second node thereof is electrically connected to an inverting input node of the operational amplifier 119. A first node of the feedback capacitor Cf is electrically connected to the inverting input node of the operational amplifier 119 and the second node of the input capacitor C0. A second node of the feedback capacitor Cf is electrically connected to an output node of the operational amplifier 119.

The switch 118 is arranged in parallel with the feedback capacitor Cf and controls the electrical connection of a feedback path between the inverting input node and the output node of the operational amplifier 119. When the switch 118 is turned off, the operational amplifier 119 inverts and amplifies a signal of the output line 207 with a gain determined based on a ratio between the capacitance value of the input capacitor CO and the capacitance value of the feedback capacitor Cf. When the switch 118 is turned on, the operational amplifier 119 is operated as a voltage follower. The reference voltage source 120 supplies a reference voltage Vref to a non-inverting input node of the operational amplifier 119. When the inverting input node and the non-inverting input node of the operational amplifier 119 are virtually short-circuited, the voltage of the inverting input node also becomes the reference voltage Vref.

The output of the operational amplifier 119 is output respectively to the hold capacitors CTS1, CTS2, CTN1, and CTN2 through the switches 125 to 128. The hold capacitors CTS1, CTS2, CTN1, and CTN2 are capacitors configured to hold the output from the operational amplifier 119. The hold capacitors CTS1 and CTS2 retain a luminance signal at time of photoelectric conversion, and the hold capacitors CTN1 and CTN2 retain a signal at time of reset. The switches 125 to 128 are arranged in an electric path between the hold capacitors CTS1, CTS2, CTN1, and CTN2 and the operational amplifier 119 and control the electrical conduction between the output node of the operational amplifier 119 and the hold capacitors CTS1, CTS2, CTN1, and CTN2. The switch 125 is controlled with a drive pulse PTSA, and the switch 127 is controlled with a drive pulse PTSAB. The switches 126 and 128 are controlled with a drive pulse PTN.

The switches 129 to 132 are turned on based on signals from the horizontal scanning circuit 16 and output the signals held in the hold capacitors CTS1, CTS2, CTN1, and CTN2 to the horizontal output lines 139 and 140. The luminance signal held in the hold capacitors CTS1 and CTS2 is output to the horizontal output line 139. That is, the reset signal is output to the horizontal output line 140. The output amplifier 15 includes a differential amplifier and outputs a difference between the signals output to the horizontal output lines 139 and 140 to outside. Due to correlated double sampling (CDS), a signal in which a noise component is removed from the luminance signal is output from the output amplifier 15. The CDS may be performed outside of the image pickup apparatus instead of being performed in the output amplifier 15. The horizontal scanning circuit 16 includes a shift register and sequentially supplies drive pulses to the column amplifying circuit 14 through column signal lines 133 to 138, with the result that signals from the column amplifying circuit 14 are output to the horizontal output lines 139 and 140.

Figure 2:
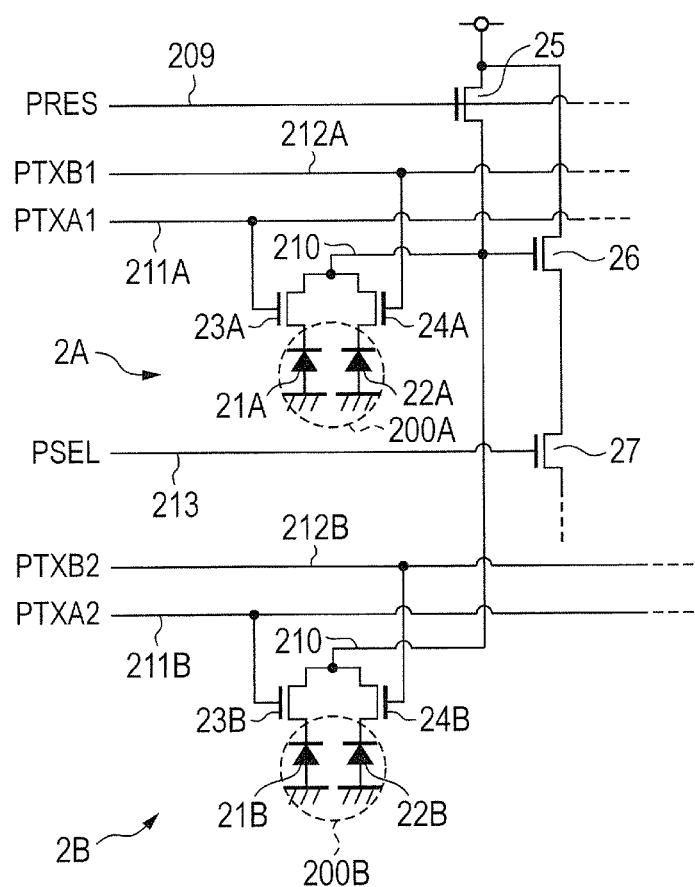
FIG. 2 is a view for illustrating a modified example of a pixel in the image pickup apparatus according to the first embodiment of the present invention.

FIG. 2 is a view for illustrating a modified example of the pixel in the image pickup apparatus according to this embodiment. The plurality of pixels 2 illustrated in FIG. 1 each include the amplifying transistor 26, but a plurality of pixels 2A and 2B may share the amplifying transistor 26 and the reset transistor 25 as illustrated in FIG. 2. In FIG. 2, components having the same functions as those in FIG. 1 are denoted by the same reference symbols as those therein, and "A" and "B" appended to each reference symbol indicate configurations of different pixels.

The first pixel 2A includes a photoelectric conversion unit 200A, and the second pixel 2B includes a photoelectric conversion unit 200B. The photoelectric conversion unit 200A includes photoelectric conversion elements 21A and 22A, and the photoelectric conversion unit 200B includes photoelectric conversion elements 21B and 22B. Light collected by a first microlens enters the photoelectric conversion elements 21A and 22A included in the first pixel 2A, and light collected by a second microlens enters the photoelectric conversion elements 21B and 22B included in the second pixel 2B.

Transfer transistors 23A, 24A, 23B, and 24B are arranged so as to correspond to the photoelectric converts 21A, 22A, 21B, and 22B, respectively. The FD region 210 of the first pixel 2A is electrically connected to the FD region 210 of the second pixel 2B, and the amplifying transistor 26 outputs a signal in accordance with the voltage of the FD region 210. As wirings configured to supply drive pulses to the transfer transistors 23A, 24A, 23B, and 24B, drive wirings 211A, 212A, 211B, and 212B are arranged. Drive pulses PTXA1 and PTXA2 are supplied to the drive wirings 211A and 211B, and drive pulses PTXB1 and PTXB2 are supplied to the drive wirings 212A and 212B. A drive pulse PRES is supplied to a gate of the reset transistor 25 through the drive wiring 209, and a drive pulse PSEL is supplied to a gate of the selection transistor 27 through the drive wiring 213.

In such configuration, the amplifying transistor 26, the reset transistor 25, and the selection transistor 27 can be shared by the plurality of pixels. With this, the number of transistors per pixel can be reduced. As a result, the area of each photoelectric conversion element can be enlarged. Note that, the number of pixels for sharing is not limited to two, and the amplifying transistor, the reset transistor, and the selection transistor may be shared by a larger number of pixels.

Figure 3:
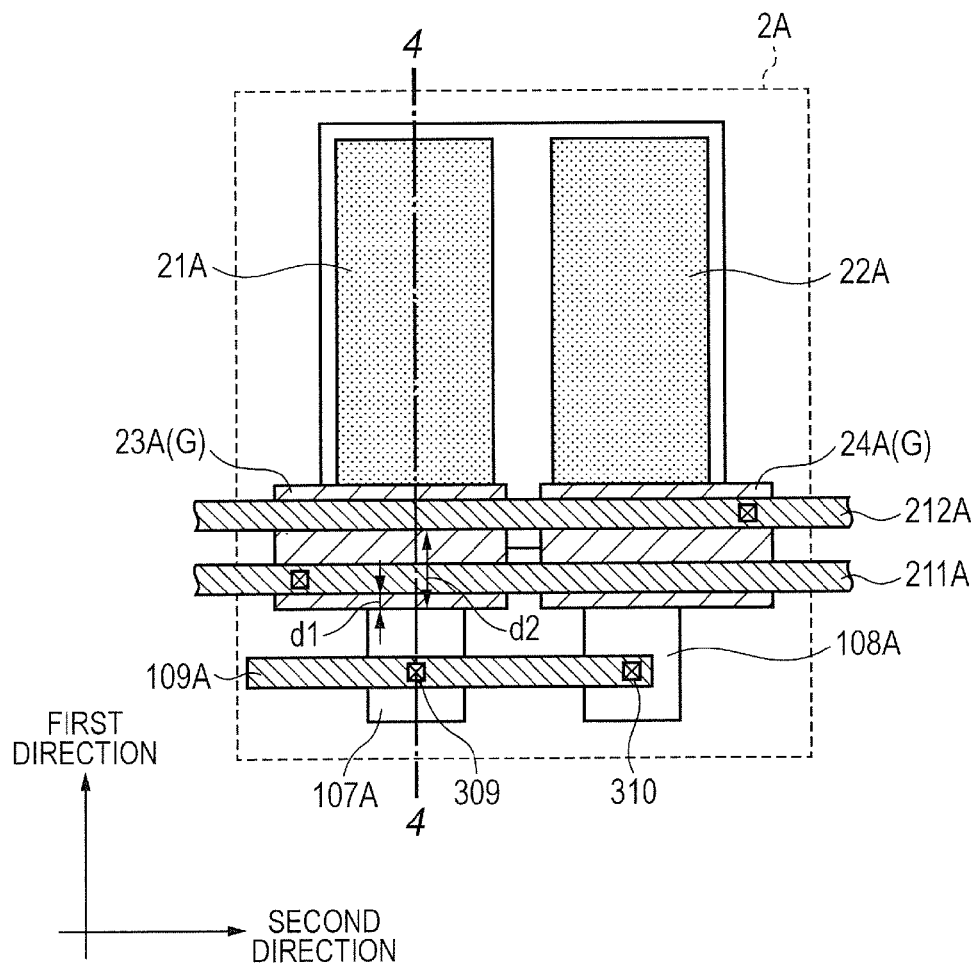
FIG. 3 is a plan view of the pixel in the image pickup apparatus according to the first embodiment of the present invention.
Figure 4:
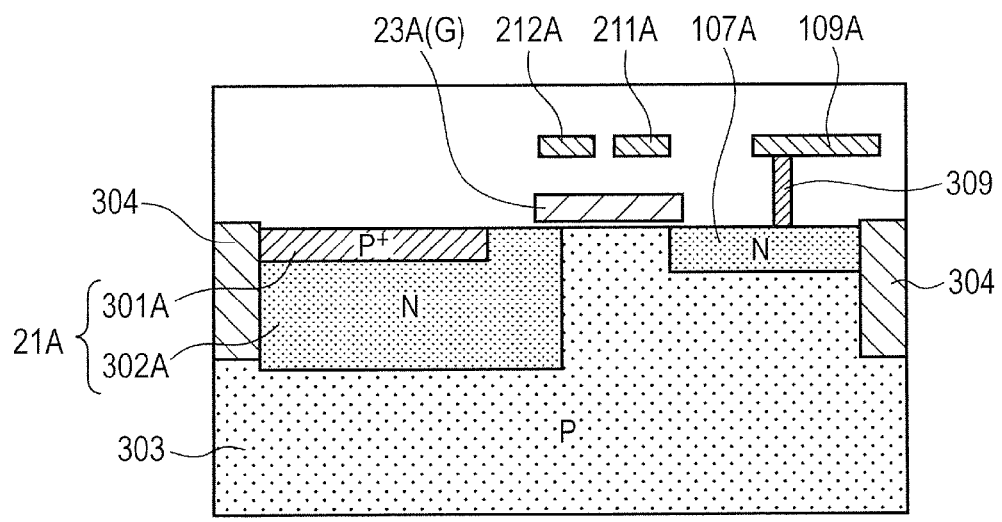
FIG. 4 is a sectional view of the pixel in the image pickup apparatus according to the first embodiment of the present invention.

Next, the structure of the pixel in the image pickup apparatus according to this example is described. FIG. 3 is a plan view of the pixel 2A in the image pickup apparatus illustrated in FIG. 2. FIG. 4 is a sectional view of the pixel taken along the line 4-4 of FIG. 3. Portions corresponding to the elements illustrated in FIG. 2 are denoted by the same reference symbols as those therein. In FIG. 3, the first direction and the second direction may correspond to, for example, the row direction and the column direction of the image pickup apparatus but are not limited thereto.

The image pickup apparatus of the present invention is formed on a semiconductor substrate such as a silicon substrate. The semiconductor substrate includes a plurality of active regions. In FIG. 3, the configuration of the photoelectric conversion elements 21A and 22A included in the photoelectric conversion unit 200A of the first pixel 2A and the vicinity of the photoelectric conversion unit 200A are illustrated. The photoelectric conversion elements 21A and 22A are formed in a first active region. Although not shown in FIG. 3, the two photoelectric conversion elements 21B and 22B included in the second pixel 2B are formed in a second active region separate from the first active region. The photoelectric conversion element 21A includes an N-type charge accumulation region 302A serving as a cathode and a P-type semiconductor region 301A of a high concentration serving as an anode. The N-type charge accumulation region 302A is formed in a P-type well layer 303, and the P-type semiconductor region 301A of a high concentration is formed in the vicinity of a semiconductor surface in an upper portion of the N-type charge accumulation region 302A. A charge is excited in accordance with incident light in the photoelectric conversion element 21A, and a charge is accumulated in the N-type charge accumulation region 302A. The photoelectric conversion elements 22A, 21B, and 22B are also configured in the same manner as in the photoelectric conversion element 21A. Further, an element isolation region 304 may be any of shallow trench isolation (STI), local oxidation of silicon (LOCOS), and PN-junction separation.

In the first active region, a first FD region 107A and a second FD region 108A are formed. A charge of the first photoelectric conversion element 21A is transferred to the first FD region 107A, and a charge of the second photoelectric conversion element 22A is transferred to the second FD region 108A. The two FD regions 107A and 108A are electrically connected to each other through contact plugs 309 and 310 and a conductive member 109A. The two FD regions 107A and 108A may be formed in the same area. The first FD region 107A, the second FD region 108A, and the conductive member 109A form the FD region 210.

A gate 23A(G) of the first transfer transistor 23A is formed between the first photoelectric conversion element 21A and the FD region 107A in a plan view. The FD region 107A also serves as a drain of the transfer transistor 23A, and the N-type charge accumulation region 302A serving as a cathode of the photoelectric conversion element 21A also serves as a source region of the transfer transistor 23A. The source and drain of the transfer transistor 23A may be formed separately from the N-type charge accumulation region 302A and the FD region 107A.

The second transfer transistor 24A is also configured in the same manner as in the first transfer transistor 23A. Specifically, a gate 24A(G) of the second transfer transistor 24A is formed between the second photoelectric conversion element 22A and the FD region 108A in a plan view. The source and drain of the second transfer transistor 24A each share the N-type charge accumulation region 302A and the FD region 108A of the second photoelectric conversion element 22A.

The amplifying transistor 26, the reset transistor 25, the selection transistor 27, and the like, which are not shown in FIG. 3, are formed in a third active region separate from the active region in which the photoelectric conversion elements 21A and 22A are arranged. Those transistors may share a source region or a drain region with other transistors. The drain region shared by the amplifying transistor 26 and the reset transistor 25 is electrically connected through a contact plug to a conductive member configured to supply a power-supply voltage. Further, the source region of the selection transistor 27 is electrically connected through a contact plug to a conductive member forming the output line 207.

The FD region 210 is electrically connected to the gate of the amplifying transistor 26 through a contact plug. Specifically, the conductive member 109A that electrically connects the two FD regions 107A and 108A to each other is electrically connected to the gate of the amplifying transistor 26 through the contact plug. Note that, the FD regions 107B and 108B corresponding to the second pixel 2B are also electrically connected to the gate of the amplifying transistor 26 through a conductive member and a contact plug (not shown).

The gate 23A(G) of the first transfer transistor 23A is electrically connected to the drive wiring 211A formed of a conductive member through a contact plug. The gate 24A (G) of the second transfer transistor 24A is electrically connected to the drive wiring 212A formed of a conductive member through a contact plug. In this embodiment, the drive wirings 211A and 212A and the conductive member 109A are arranged on the same wiring layer, but may be formed on different wiring layers. Although not shown, conductive members forming the output line 207, a power source wiring, a GND wiring, a wiring for light-shielding, and the like are formed.

Although not shown, a lens array having a plurality of microlenses is arranged in the image pickup apparatus, and each microlens is formed in an upper portion of the photoelectric conversion elements 21A and 22A of the pixel. In the case where one microlens is formed for one pixel, it is desired that the microlens be formed so as to collect light in a substantially intermediate region of the plurality of photoelectric conversion elements in the same pixel in order to perform focus detection. Note that, the present invention is not limited to such configuration.

Now, the characteristic configuration of the present invention is described. As illustrated in FIG. 3, the conductive member 109A, which electrically connects the two FD regions 107A and 108A to each other, is formed in parallel with the first drive wiring 211A electrically connected to the gate 23A(G) of the first transfer transistor 23A while being opposed thereto. The conductive member 109A extends beyond an end portion of the FD region 210. Herein, the end portion of the FD region 210 refers to a boundary between the FD region 107A and the element isolation region 304. Due to such structure, the capacitance component between the gate 23A(G) of the first transfer transistor 23A and the first drive wiring 211A, and the FD region 210 can be increased. It is sufficient that the conductive member 109A extend while being opposed to the first drive wiring 211A, and the conductive member 109A and the drive wiring 211A may not be necessarily required to be parallel to each other.

The first drive wiring 211A is formed more closely to the FD region 210 compared to the second drive wiring 212A. Specifically, a distance d1 between the first drive wiring 211A and the end portion of the FD region 210 is smaller than a distance d2 between the second drive wiring 212A and the end portion of the FD region 210. Thus, a parasitic capacitance between the first drive wiring 211A, and the FD region 210 and the conductive member 109A can be further increased.

When a drive pulse at a high level is applied to the gate of the transfer transistor through the first drive wiring 211A in such configuration, the voltage of the FD region 210 increases due to an increase in parasitic capacitance. The negative charge excited in the photoelectric conversion element 22A is easily transferred to the FD region 210, and a signal to noise ratio is improved, with the result that a fixed pattern noise and a random noise can be reduced.

Figure 5:
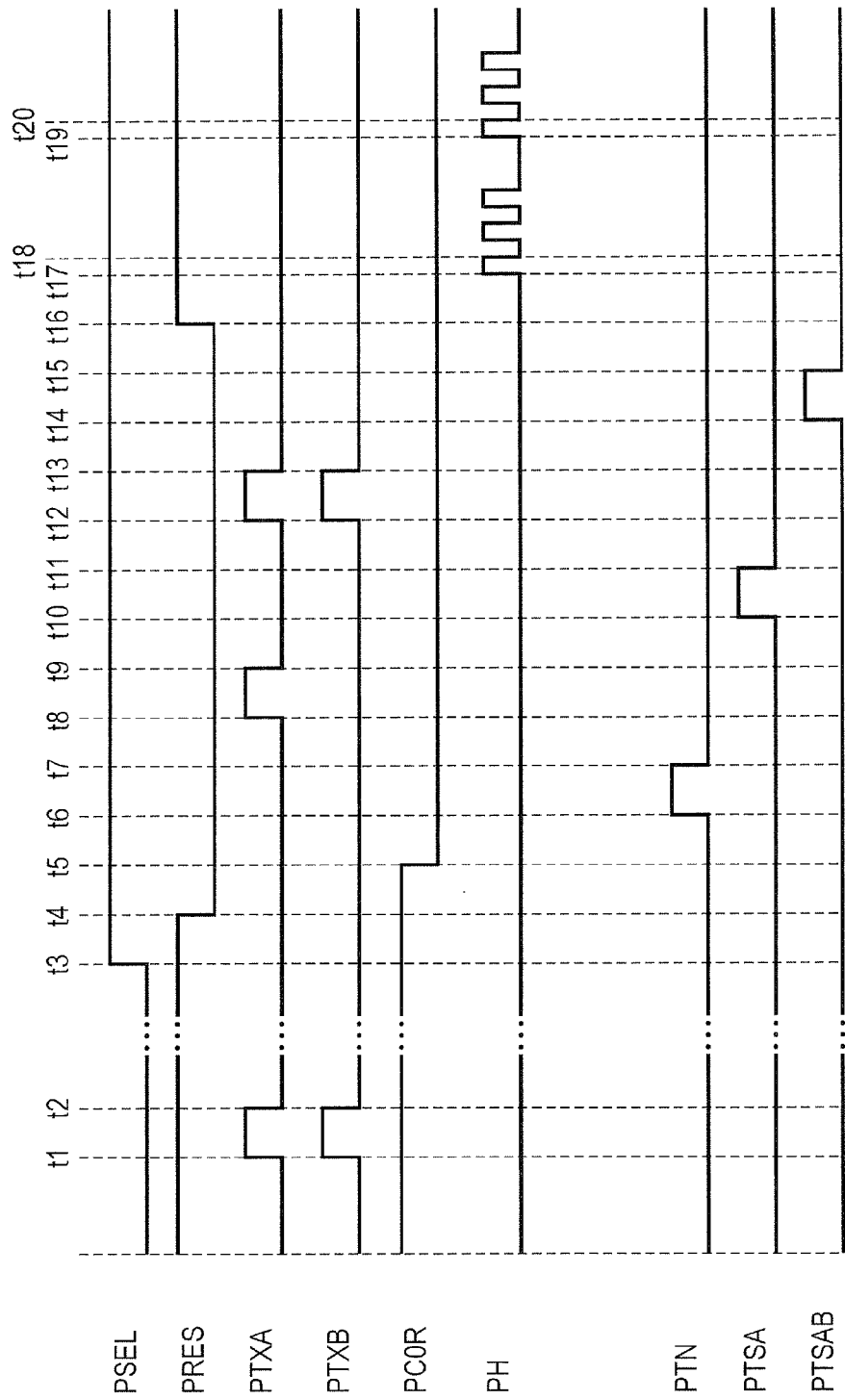
FIG. 5 is a timing chart of the image pickup apparatus according to the first embodiment of the present invention.

Next, the operation of the image pickup apparatus according to this embodiment is described with reference to FIG. 5. FIG. 5 is a timing chart of the image pickup apparatus illustrated in FIG. 1. When each drive pulse becomes a high level, the corresponding transistors are turned on (brought into a conductive state), and when each drive pulse becomes a low level, the corresponding transistors are turned off (brought into a non-conductive state).

First, at time t1, the drive pulses PTXA and PTXB supplied to the drive wirings 211A and 212A become a high level, and the transfer transistors 23A and 24A are turned on. At this time, the drive pulse PRES supplied to the drive wiring 209 is at a high level. Therefore, the reset transistor 25 is turned on, and the photoelectric conversion elements 21A and 22A are reset.

Next, at time t2, the drive pulses PTXA and PTXB become a low level, and the transfer transistors 23A and 24A are turned off. Simultaneously, a charge accumulation period in the photoelectric conversion elements 21A and 22A starts. The drive pulse PRES maintains a high level, and the reset transistor 25 remains turned on. Therefore, the reset operation of the FD region 210 serving as the input node of the amplifying transistor 26 still continues.

At time t3, the drive pulse PSEL supplied to the drive wiring 213 becomes a high level, and the selection transistor 27 is turned on. At time t4, the drive pulse PRES supplied to the drive wiring 209 becomes a low level, and the reset transistor 25 is turned off. With this, the reset operation of the input node of the amplifying transistor 26 ends. Then, a signal at time of reset (hereinafter referred to as "reset signal") of the input node is read from the input node to the output line 207 and is input to the column amplifying circuit 14. At this time, a drive pulse PC0R is at a high level, and hence the switch 118 is in a conductive state. The operational amplifier 119 is operated as a voltage follower and performs buffer output of the reference voltage Vref. In this state, the reset signal is supplied to the input capacitor C0.

Next, at time t5, the drive pulse PC0R becomes a low level, and the switch 118 is turned off. The operational amplifier 119 amplifies the reset signal at an amplification rate (−C0/Cf) determined based on the capacitance ratio between the input capacitor C0 and the feedback capacitor Cf. A voltage of Vref+Δn×(−C0/Cf) is output from the operational amplifier 119. Herein, Δn refers to a noise component such as a kTC noise generated at time of reset, a fixed pattern noise caused by the variation in threshold value of the transistors, or the like.

At time t6, the drive pulse PTN is switched from a low level to a high level, and the switches 126 and 128 are turned on. With this, the amplified reset signal is supplied to the hold capacitors CTN1 and CTN2. At time t7, the drive pulse PTN is switched from a high level to a low level, and the switches 126 and 128 are turned off. Due to those operations, the reset signal is supplied to the hold capacitors CTN1 and CTN2, and then the hold capacitors CTN1 and CTN2 and the output node of the operational amplifier 119 are brought into a non-conductive state.

At time t8, the drive pulse PTXA becomes a high level and the first transfer transistor 23A is turned on, with the result that the charge of the first photoelectric conversion element 21A is transferred to the FD region 210. At time t9, the drive pulse PTXA becomes a low level, and the first transfer transistor 23A is turned off. With this, a signal based on the charge generated in the first photoelectric conversion element 21A (hereinafter referred to as "luminance signal") is supplied to the column amplifying circuit 14 through the amplifying transistor 26 and the output line 207. Due to the above-mentioned operation, the luminance signal corresponding to the signal of the photoelectric conversion element 21A can be generated in the output line 207.

During a period from time t8 to time t9, the drive pulse PTXB is at a low level, and hence the second transfer transistor 24A is maintained turned off. That is, at time t8, from a state in which both the first transfer transistor 23A and the second transfer transistor 24A are turned off, the first transfer transistor 23A is turned on while the second transfer transistor 24A remains turned off.

In the column amplifying circuit 14, a value obtained by multiplying a voltage change by the amplification rate (−C0/Cf) is output. Specifically, when the voltage change of a negative luminance signal in the output line 207 is defined as ΔVa, an output voltage V(A) in the operational amplifier 119 is represented by the following expression.

$$V(A)=Vref+(\Delta Va+\Delta n)\times(-C0/Cf) \qquad (1)$$

Next, at time t10, the drive pulse PTSA is switched from a low level to a high level, and the switch 125 is turned on. At time t11, the drive pulse PTSA is switched from a high level to a low level, and the switch 125 is turned off. Due to this operation, the luminance signal at time of photoelectric conversion is held in the hold capacitor CTS1.

At time t12, the drive pulse PTXA becomes a high level, and the drive pulse PTXB becomes a high level during at least a part of a high-level period of the drive pulse PTXA. With this, both the first transfer transistor 23A and the second transfer transistor 24A are turned on in parallel. As a result, both the charges of the photoelectric conversion elements 21A and 22A are transferred to the FD region 210, and a luminance signal for forming an image can be generated in the output line 207.

Note that, the drive pulses PTXA and PTXB may be simultaneously shifted from a low level to a high level, or the drive pulse PTXA may be shifted from a low level to a high level prior to the drive pulse PTXB. Alternatively, the drive pulse PTXA may be shifted from a low level to a high level after the drive pulse PTXB.

During a period from the time when the charge of the photoelectric conversion element 21A is transferred to the time when both the charges of the photoelectric conversion elements 21A and 22A are transferred to the FD region 210 in parallel, the voltage of the FD region 210, that is, the voltage of the input node of the amplifying transistor 26 is not reset. Specifically, during a period from the time when the first transfer transistor 23A is turned on to the time when both the first transfer transistor 23A and the second transfer transistor 24A are turned on, the reset transistor 27 is maintained turned off.

Then, the luminance signal based on the charge transferred to the FD region 210, that is, the added luminance signal of the photoelectric conversion elements 21A and 22A is supplied to the column amplifying circuit 14. When the voltage change of a negative luminance signal in the output line 207 is defined as ΔV(a+b), an output voltage V(A+B) in the operational amplifier 119 is expressed by the following expression. Note that, it is assumed that a noise component Δn is superimposed on ΔV(a+b) in addition to the luminance signal.

$$V(A+B)=Vref+(\Delta V(a+b)+\Delta n)\times(-C0/Cf) \qquad (2)$$

At time t14, the drive pulse PTSAB is switched from a low level to a high level, and the switch 127 is turned on. At time t15, the drive pulse PTSAB is switched from a high level to a low level, and the switch 127 is turned off. Due to this operation, the voltage V(A+B) of the output node of the operational amplifier 119 is written to the hold capacitor CTS2. Then, the output amplifier 15 outputs a differential voltage between the voltage V(A+B) in the hold capacitor CTS2 and the voltage (Vref+Δn×(−C0/Cf)) in the hold capacitor CTN2 in accordance with the following expression.

$$V(A+B)-(Vref+\Delta n\times(-C0/Cf))=\Delta V(a+b)\times(-C0/Cf) \qquad (3)$$

This corresponds to a luminance signal obtained by adding signals of two photoelectric conversion elements included in one pixel. When a differential voltage between the voltage of the hold capacitor CTS2 and the voltage of the hold capacitor CTN2 is obtained, a noise component Δn such as a kTC noise generated at time of reset, a fixed pattern noise caused by the variation in threshold value of the transistors, or the like is removed.

A differential voltage between the voltage V(A) of the hold capacitor CTS1 and the voltage (Vref+Δn×(−C0/Cf)) of the hold capacitor CTN2 is represented as follows.

$$V(A)-(Vref+\Delta n\times(-C0/Cf))=\Delta Va\times(-C0/Cf) \qquad (4)$$

This corresponds to a luminance signal of only the first photoelectric conversion element 21A. The signal obtained by the first photoelectric conversion element 21A corresponds to information on a collected luminous flux that passes through a part of a pupil of a photographing lens.

Further, a differential voltage of those differential voltages is represented by the following expression.

$$(\Delta V(a+b) \times (-C0/Cf) - (\Delta Va \times (-C0/Cf)) = (\Delta V(a+b) - \Delta Va) \times (-C0/Cf)) \quad (5)$$

This corresponds to a luminance signal of only the second photoelectric conversion element 22A. The signal obtained by the second photoelectric conversion element 22A corresponds to information on a collected luminous flux that passes through another part of the pupil of the photographing lens. The plurality of (two) photoelectric conversion elements included in each pixel are arranged at different positions in a plan view. Then, focus detection from the information on the two luminous fluxes of the photoelectric conversion elements 21A and 22A can be performed.

The above-mentioned calculation may be performed in the image pickup apparatus, or may be performed in a signal processing unit after the voltages are output from the image pickup apparatus. The luminance signal of only the first photoelectric conversion element 21A and the added luminance signal of the two photoelectric conversion elements 21A and 22A are obtained in the image pickup apparatus as described above.

Next, at time t16, the drive pulse PRES becomes a high level, and the reset transistor 25 is turned on, with the result that the voltage of the FD region 210 is reset.

The signals held in the hold capacitors CTS1, CTS2, CTN1, and CTN2 are read when the drive pulses 133 and 134 synchronized with a pulse PH are sequentially turned on after time t17. In this embodiment, the output amplifier configured to perform differential amplification is arranged in a latter stage of the horizontal output lines 139 and 140. Therefore, a difference of the signals held in the hold capacitors CTS1 and CTN1 can be output to outside of the image pickup apparatus. A difference of the signals retained in the hold capacitors CTS2 and CTN2 can be output to outside of the image pickup apparatus. With this, a noise generated in the horizontal output lines 139 and 140 can be reduced. The output amplifier 15 is not necessarily required to perform differential amplification and may be a simple buffer circuit. After that, a signal in each column is sequentially scanned by the horizontal scanning circuit 16 and read to the horizontal output lines 139 and 140.

As described above, after the signal of only the first photoelectric conversion element 21A is read, the added signal of the first photoelectric conversion element 21A and the second photoelectric conversion element 22A is read. When the signal of only the first photoelectric conversion element 21A is read first, a low-noise signal is obtained. This is because, as the hold time in the hold capacitors CTS1, CTS2, CTN1, and CTN2 is longer, the signal is liable to be influenced by a leakage current caused by the capacitors and the switches. Note that, the present invention does not exclude the case in which a read order is reversed.

Figure 6:
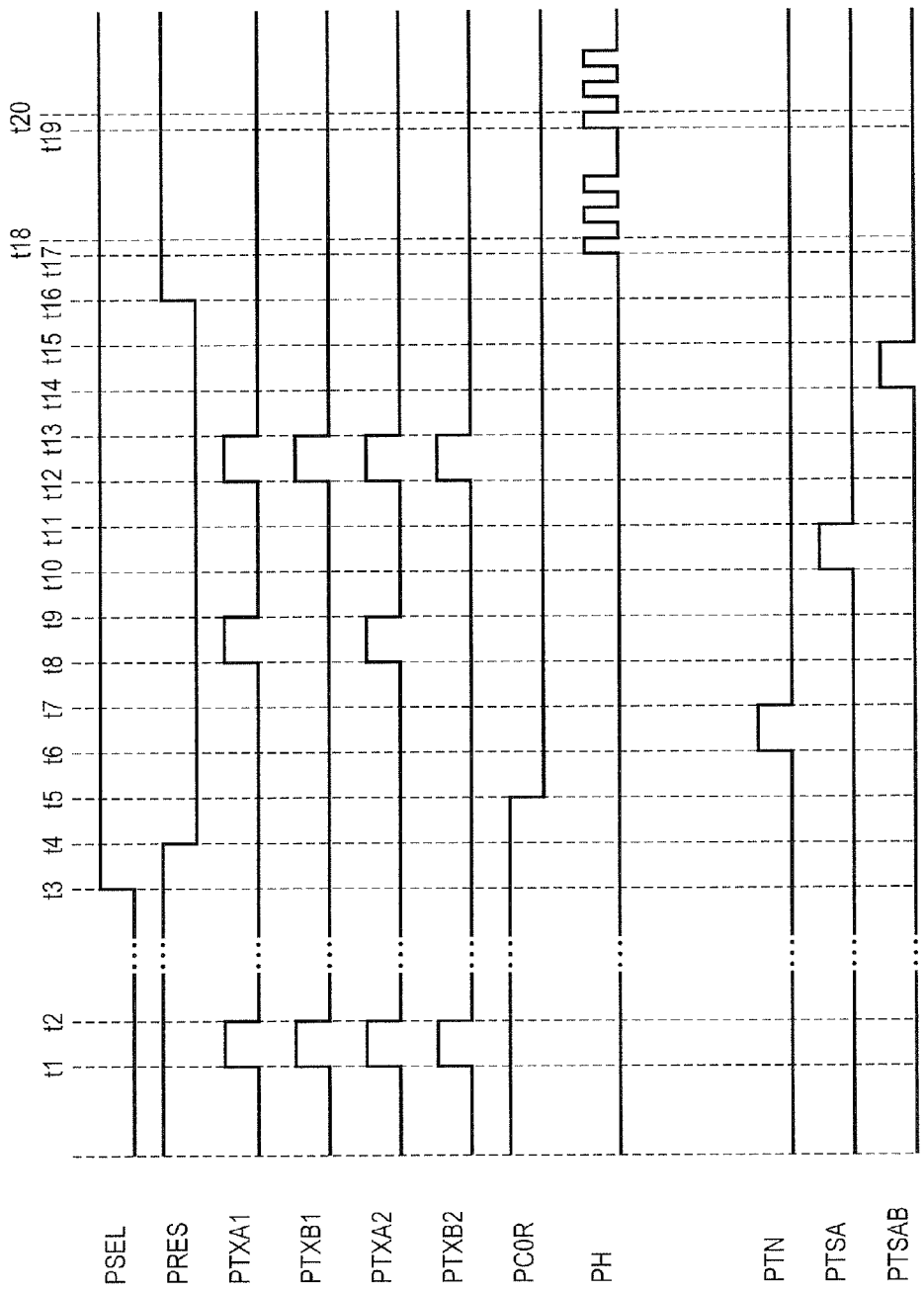
FIG. 6 is a timing chart of the image pickup apparatus according to the first embodiment of the present invention.

Next, the operation of the image pickup apparatus illustrated in FIG. 2 is described with reference to FIG. 6. In the operation of the image pickup apparatus illustrated in FIG. 2, the read operation similar to that of the timing chart illustrated in FIG. 5 can also be performed. In the image pickup apparatus illustrated in FIG. 2, signals from the photoelectric conversion elements 21A and 22A and signals from the photoelectric conversion elements 21B and 22B can be read as signals in different rows.

Specifically, after a signal of the photoelectric conversion element 21A of the first pixel 2A is read, the charges of the photoelectric conversion elements 21A and 22A are added in the FD region 210, and thus a signal for focus detection and a signal for image pickup are obtained. Similarly, after the FD region 210 is reset, a signal of the photoelectric conversion element 21B of the second pixel 2B is read, and then the charges of the photoelectric conversion elements 21B and 22B are added in the FD region 210. With this, a signal for focus detection and a signal for image pickup in the second pixel 2B are obtained.

Further, in the image pickup apparatus illustrated in FIG. 2, the two different pixels 2A and 2B share the amplifying transistor 26. Thus, all the signals of the photoelectric conversion elements 21A, 21B, 22A, and 22B can also be added in the FD region 210. FIG. 6 is a diagram for illustrating a drive method in the case where two pixel signals are added and read. In this case, drive pulses supplied to the transfer transistors 23A and 24A are respectively defined as PTXA1 and PTXB1. Further, drive pulses supplied to the transfer transistors 23B and 24B are respectively defined as PTXA2 and PTXB2.

At time t1, the drive pulses PTXA1, PTXB1, PTXA2, and PTXB2 become a high level, and the transfer transistors 23A, 24A, 23B, and 24B are turned on. At this time, the drive pulse PRES supplied to the drive wiring 209 is at a high level. Therefore, the reset transistor 25 is turned on, and the photoelectric conversion elements 21A, 22A, 21B, and 22B are reset.

At time t2, the drive pulses PTXA1, PTXB1, PTXA2, and PTXB2 become a low level, and the transfer transistors 23A, 24A, 23B, and 24B are turned off. At time t3, the drive pulse PSEL becomes a high level, and the selection transistor 27 is turned on. At time t4, the drive pulse PRES becomes a low level, and the reset transistor 25 is turned off. With this, the reset signal at the input node is read to the output lint 207. At this time, the drive pulse PC0R is at a high level. Therefore, the switch 118 is brought into a conductive state, and the operational amplifier 119 performs buffer output of the reference voltage Vref.

At time t5, the drive pulse PC0R becomes a low level, and the switch 118 is turned off. The operational amplifier 119 amplifies the reset signal at an amplification rate (−C0/Cf). At time t6, the drive pulse PTN is switched from a low level to a high level, and the switches 126 and 128 are turned on. The reset signal amplified by the operational amplifier 119 is supplied to the hold capacitors CTN1 and CTN2. At time t7, the drive pulse PTN is switched from a high level to a low level, and the switches 126 and 128 are turned off, with the result that the reset signal is held in the hold capacitors CTN1 and CTN2.

At time t8, the drive pulses PTXA1 and PTXA2 are switched from a low level to a high level, and at time t9, the drive pulses PTXA1 and PTXA2 are switched from a high level to a low level. With this operation, the charges of the photoelectric conversion elements 21A and 21B included in the different pixels are added in the FD region 210. At time t10 to time t11, the drive pulse PTSA becomes a high level, and the luminance signal is held in the retention capacitor CTS1. The output amplifier 15 outputs a signal of a differential voltage between the luminance signal of the hold capacitor CTS1 and the reset signal of the hold capacitor CTN1. This signal is used as a signal for focus detection.

At time t12, the drive pulses PTXA1, PTXA2, PTXB1, and PTXB2 are switched from a low level to a high level. After that, at time t13, the drive pulses PTXA1, PTXA2, PTXB1, and PTXB2 are switched from a high level to a low level. With this operation, the charges of all the photoelectric conversion elements 21A, 22A, 21B, and 22B included in the different pixels are added in the FD region 210. At time t14 to time t15, the drive pulse PTSAB becomes a high level, and the luminance signal is held in the hold capacitor CTS2. The output amplifier 15 outputs a signal of a differential voltage between the luminance signal of the hold capacitor CTS2 and the reset signal of the hold capacitor CTN2. This signal is used as a signal for image pickup.

In the above-mentioned read operation, the signal for focus detection is obtained by adding the charges of the plurality of photoelectric conversion elements included in the different pixels. Therefore, an S/N can be enhanced, and focus detection with high accuracy can be performed.

Further, in the image pickup apparatus according to this embodiment, a signal can be read at a high speed. Now, this effect is described in detail. In general, when the voltage of the gate of the transfer transistor is shifted from a level corresponding to OFF to a level corresponding to ON, the voltage of the FD region changes due to capacitive coupling between the conductive member and the FD region that are electrically connected to the gate of the transfer transistor. For example, in the case where the transfer transistor is an nMOS transistor, the transfer transistor is turned on when the voltage of the gate is changed from 0 V to 3.3 V. In this case, the voltage of the FD region increases due to the capacitance component between the FD region and the gate, and an electron that is a negative charge excited in the photoelectric conversion element is easily transferred to the FD region. Therefore, the transfer efficiency can be enhanced. In addition, the maximum amount of the charge to be transferred is increased, and the charge can be transferred at a high speed.

In this example, a signal based on the charge of the first photoelectric conversion element 21A among the two photoelectric conversion elements is read independently. Therefore, of the two transfer transistors 23A and 24A, the first transfer transistor 23A is controlled from OFF to ON while the second transfer transistor 24A is maintained turned off. The conductive member 109A electrically connected to the FD region 210 is formed at a position closer to the drive wiring 211A for the first transfer transistor 23A than to the drive wiring 212A for the second transfer transistor 24A. With this, the voltage of the FD region 210 when the charge of the first photoelectric conversion element 21A is transferred can be increased. As a result, the transfer efficiency of a charge can be enhanced.

Figure 7:
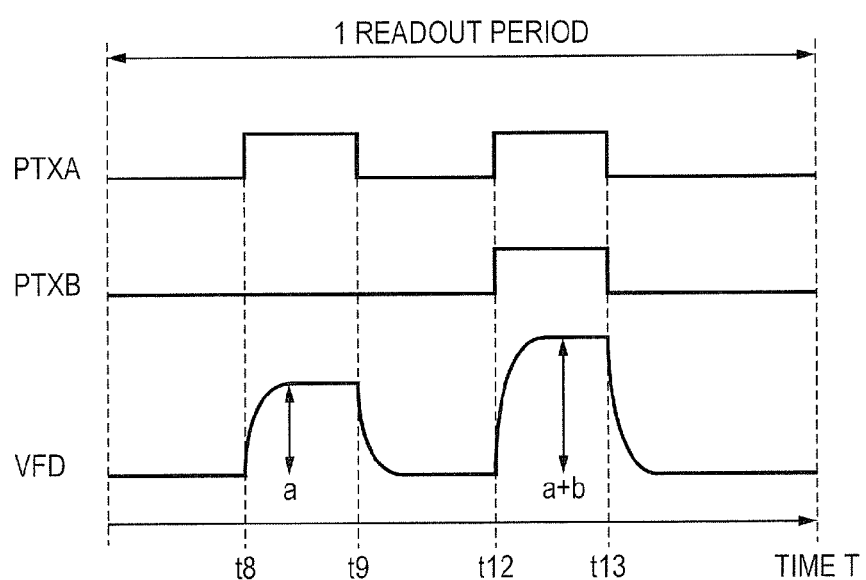
FIG. 7 is a graph for showing a change in voltage of an FD region of the image pickup apparatus according to the first embodiment of the present invention.

FIG. 7 is a diagram for illustrating a change in voltage of the FD region of the image pickup apparatus according to this embodiment. A waveform in a lower section of FIG. 7 indicates a voltage VFD of the FD region 210 during a read period. A waveform in an upper section indicates the drive pulse PTXA supplied to the drive wiring 211A of the first transfer transistor 23A, and a waveform in a middle section indicates the drive pulse PTXB supplied to the drive wiring 212A of the second transfer transistor 24A. Note that, time t8, time t9, time t12, and time t13 of FIG. 7 respectively correspond to the time t8, the time t9, the time t12, and the time t13 of FIG. 5 and FIG. 6.

At time t8, the drive pulse PTXA is switched from a low level to a high level, and the transfer transistor 23A is turned on. With this, the charge accumulated in the photoelectric conversion element 21A is put in a state of being read to the FD region 210. As described above, this charge is used as, for example, a signal for focus detection. The change amount of the voltage VFD of the FD region 210 at this time is defined as "a", and the change amount of the voltage VFD of the FD region 210 in the case where only the drive pulse PTXB is switched from a low level to a high level is defined as "b".

In this embodiment, the two FD regions 107A and 108A are electrically connected to each other through the conductive member 109A. The conductive member 109A is formed in parallel with the drive wiring 211A electrically connected to the gate 23A(G) of the first transfer transistor 23A and extends beyond the end portion of the FD region 210. In this case, the end portion of the FD region 210 indicates a boundary between the FD region 107A and the element isolation region 304.

Due to such structure, the capacitance component between the gate 23A(G) of the first transfer transistor 23A and the conductive member 109A, and the FD region 210 increases, and the change amount "a" of the FD region 210 also increases. Specifically, in this embodiment, a charge can be transferred in a state in which the voltage of the FD region 210 is increased further. As a result, the maximum amount of a charge to be transferred can be increased, and the charge can be transferred at a high speed.

At time t12 to time t13, the following effect is obtained by setting both the drive pulses PTXA and PTXB at a high level in parallel. As described above, when the voltage of the gate of the transfer transistor is shifted from a low level to a high level, the voltage of the FD region 210 increases due to the capacitive coupling between the drive wiring of the transfer transistor and the FD region 210. When the voltages of the gates of the two transfer transistors 23A and 24A are shifted from a low level to a high level in parallel, an increase amount of the voltage VFD of the FD region 210 increases compared to the case where only one transfer transistor is turned on. When the voltage VFD of the FD region 210 increases, the charges of the photoelectric conversion elements 21A and 22A are easily transferred to the FD region 210. Thus, the transfer efficiency of a charge can be enhanced. The effect of the enhancement of the transfer efficiency is obtained as long as the two transfer transistors are turned on at least in parallel. Note that, even when the timings at which the two transfer transistors are turned on/off are not matched, as long as there is a period during which the two transfer transistors are simultaneously turned on, the transfer efficiency can be further enhanced.

In particular, in the image pickup apparatus in which one pixel 2 includes two photoelectric conversion elements 21A and 22A as in this embodiment, a potential barrier is provided between the two photoelectric conversion elements 21A and 22A in most cases. The potential barrier makes the potential distribution of the photoelectric conversion element complicated. Therefore, a residual charge is liable to occur at time of transfer, and a fixed pattern noise or a random noise may be generated in some cases. In contrast, when the drive pulses PTXA and PTXB are simultaneously turned into a high level, a charge can be transferred in a state in which the voltage of the FD region 210 is high, and the fixed pattern noise or the random noise can be reduced.

Figure 8:
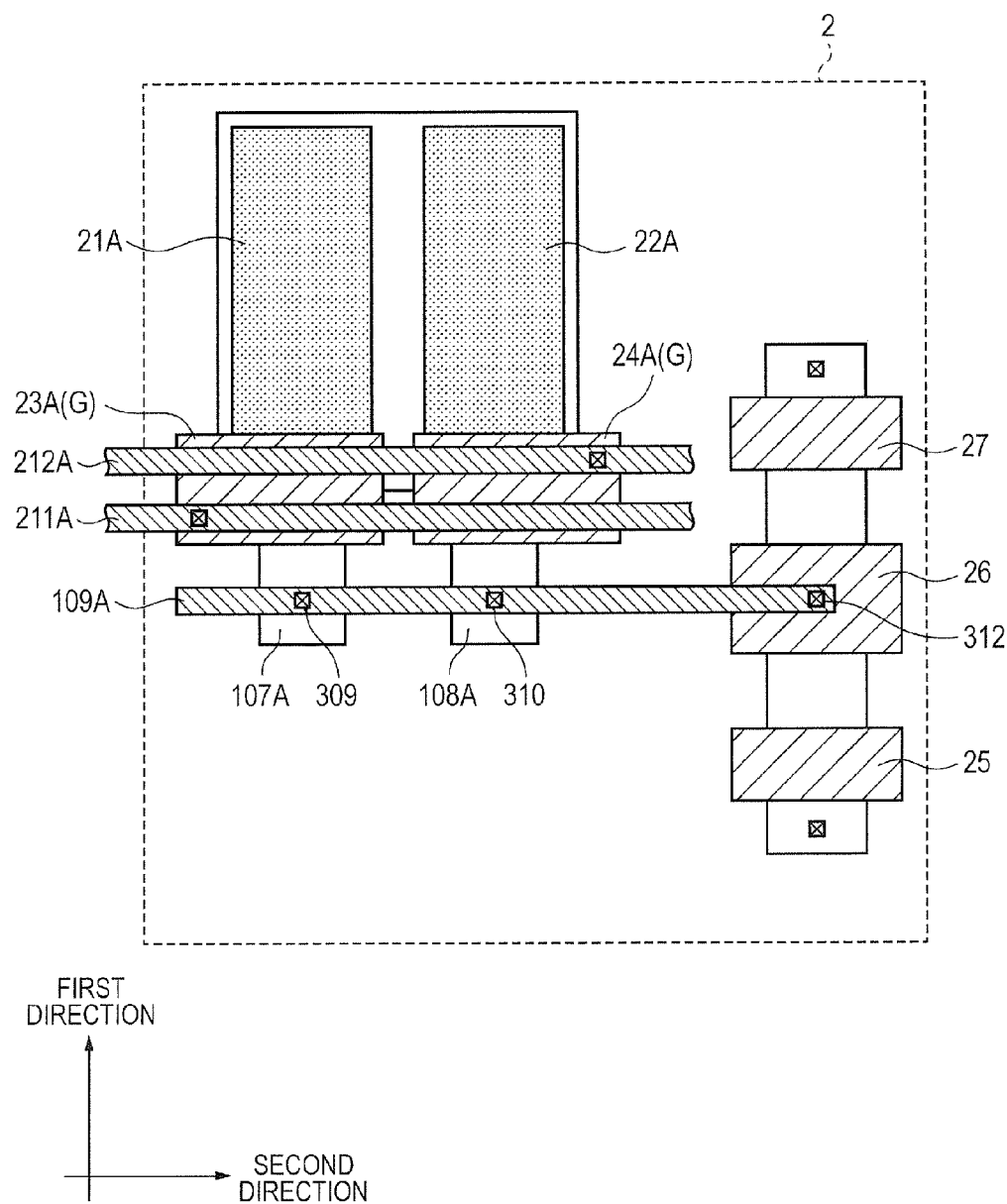
FIG. 8 is a plan view of the pixel in the image pickup apparatus according to the first embodiment of the present invention.

FIG. 8 is a plan view of the pixel in the image pickup apparatus according to this embodiment, in which a third active region is further illustrated. In the third active region, the reset transistor 25, the amplifying transistor 26, and the selection transistor 27 are formed. The reset transistor 25 and the amplifying transistor 26 are formed so as to share a drain region, and the drain region is electrically connected through the contact plug to the conductive member configured to supply a power-supply voltage. A source region of the amplifying transistor 26 and a drain region of the selection transistor 27 are formed so as to be shared. The source region of the selection transistor 27 is electrically connected through the contact plug to the conductive member forming the output line 207.

The conductive member 109A electrically connects the first FD region 107A and the second FD region 108A to each other through the contact plugs 309 and 310 and extends in parallel with the first drive wiring 211A while being opposed thereto. One end of the conductive member 109A is electrically connected to the gate of the amplifying transistor 26 through a contact plug 312, and the other end extends beyond the end portion of the active region of the first FD region 107A. With such configuration, the capacitance between the first drive wiring 211A and the conductive member 109A increases. The capacitance component between the gate 23A(G) of the transfer transistor 23A and the conductive member 109A, and the FD region 210 can be increased, and the transfer efficiency of a charge can be enhanced.

Figure 9:
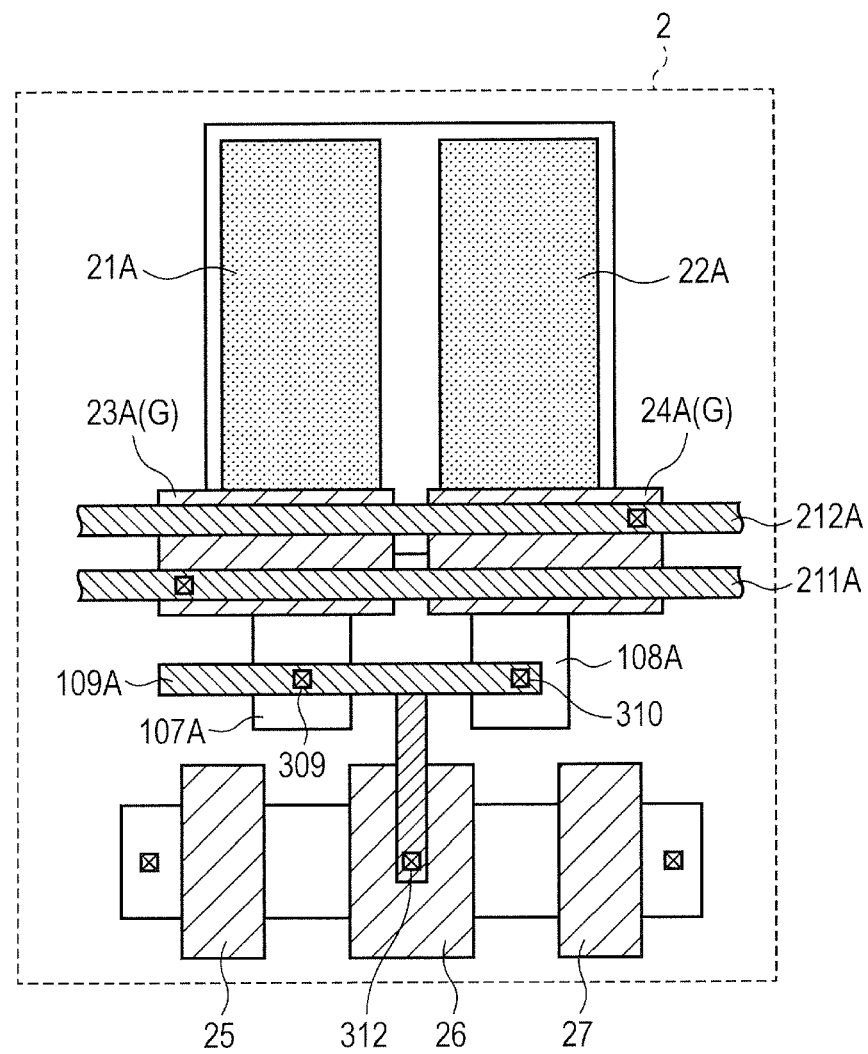
FIG. 9 is a plan view of the pixel in the image pickup apparatus according to the first embodiment of the present invention.

FIG. 9 is a plan view of the pixel in the image pickup apparatus according to this embodiment, in which a modified example of the configuration illustrated in FIG. 8 is illustrated. The reset transistor 25, the amplifying transistor 26, and the selection transistor 27 are formed in the third active region. The third active region extends in a direction (second direction) perpendicular to a direction (first direction) in which the photoelectric conversion elements 21A and 22A extend. The conductive member 109A extends in parallel with the first drive wiring 211A while being opposed thereto, and one end of the conductive member 109A is electrically connected to the second FD region 108A through the contact plug 310. The other end of the conductive member 109A extends beyond the end portion of the active region of the first FD region 107A. The conductive member 109A is electrically connected to the gate of the amplifying transistor 26 through the contact plug 312. With such configuration, the capacitive coupling between the first drive wiring 211A and the conductive member 109A can be increased, and the transfer efficiency of a charge can be enhanced.

Second Embodiment

Figure 10:
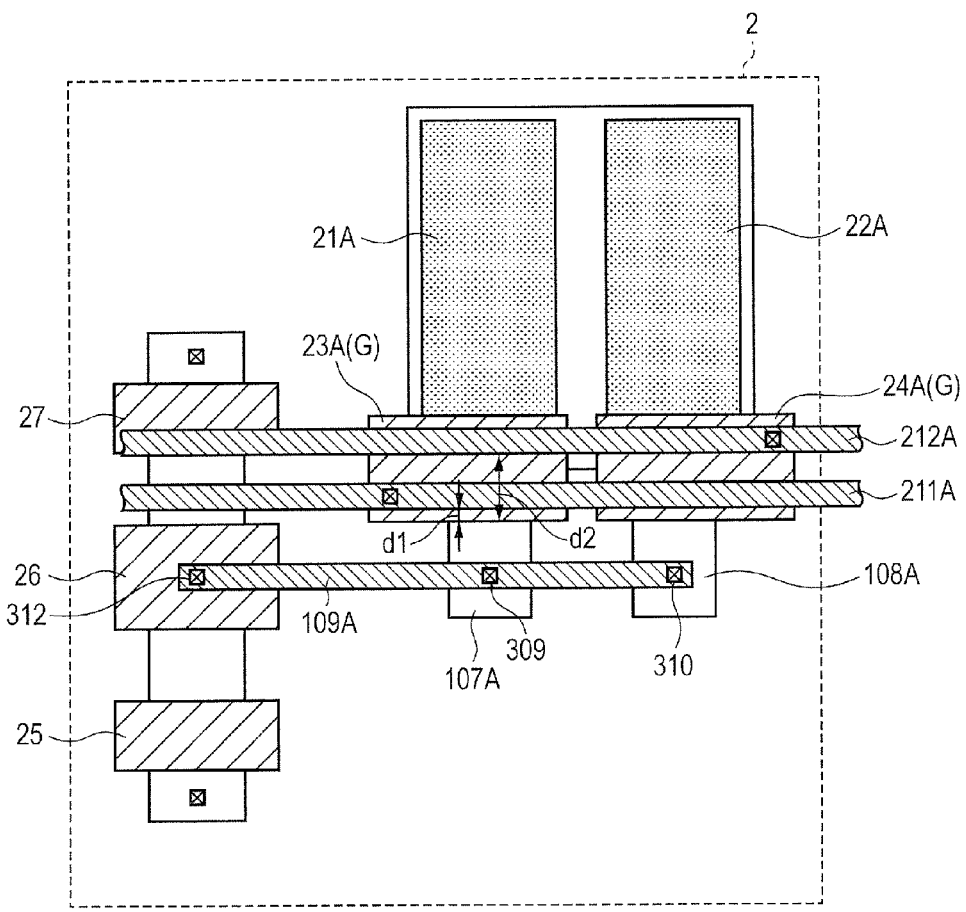
FIG. 10 is a plan view of a pixel in an image pickup apparatus according to a second embodiment of the present invention.

FIG. 10 is a plan view of a pixel in an image pickup apparatus according to a second embodiment of the present invention. The configurations not shown in FIG. 10 are the same as those according to the first embodiment, and hence the descriptions thereof are omitted. In this embodiment, the conductive member 109A also extends in parallel with the first drive wiring 211A while being opposed thereto and extends beyond the end portion of the active region of the FD regions 107A and 108A. The third active region, in which the amplifying transistor 26 is formed, is formed in parallel with the direction (first direction) in which the photoelectric conversion elements 21A and 22A extend. The third active region is formed at a position closer to the gate 23A(G) of the first transfer transistor 23A than to the gate 24A(G) of the second transfer transistor 24A. Specifically, the gate of the amplifying transistor 26 and the gate 23A(G) of the first transfer transistor 23A are close to each other, and the parasitic capacitance between the first drive wiring 211A and the conductive member 109A increases. The parasitic capacitance between the conductive member 109A and the FD region 210 can be further increased, and the transfer efficiency of a charge can be further enhanced.

In this embodiment, the first drive wiring 211A is formed more closely to the FD region 210 compared to the second drive wiring 212A. Specifically, the distance d1 between the first drive wiring 211A and the end portion of the FD region 210 is smaller than the distance d2 between the second drive wiring 212A and the end portion of the FD region 210. Thus, the parasitic capacitance between the first drive wiring 211A and the FD region 210 and between the first drive wiring 211A and the conductive member 109A increases, and hence the transfer efficiency of a charge can be enhanced.

Third Embodiment

Figure 11:
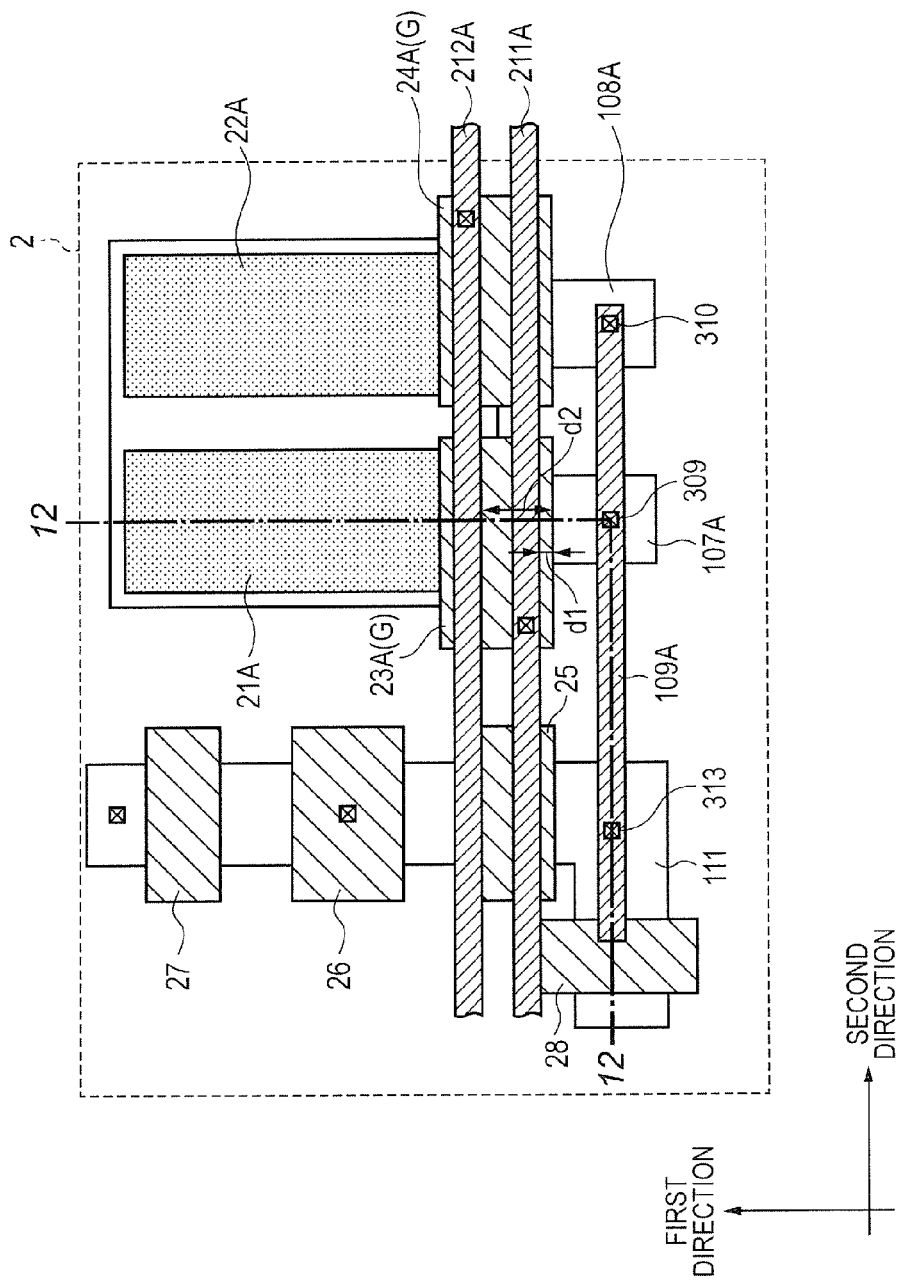
FIG. 11 is a plan view of a pixel in an image pickup apparatus according to a third embodiment of the present invention.
Figure 12:
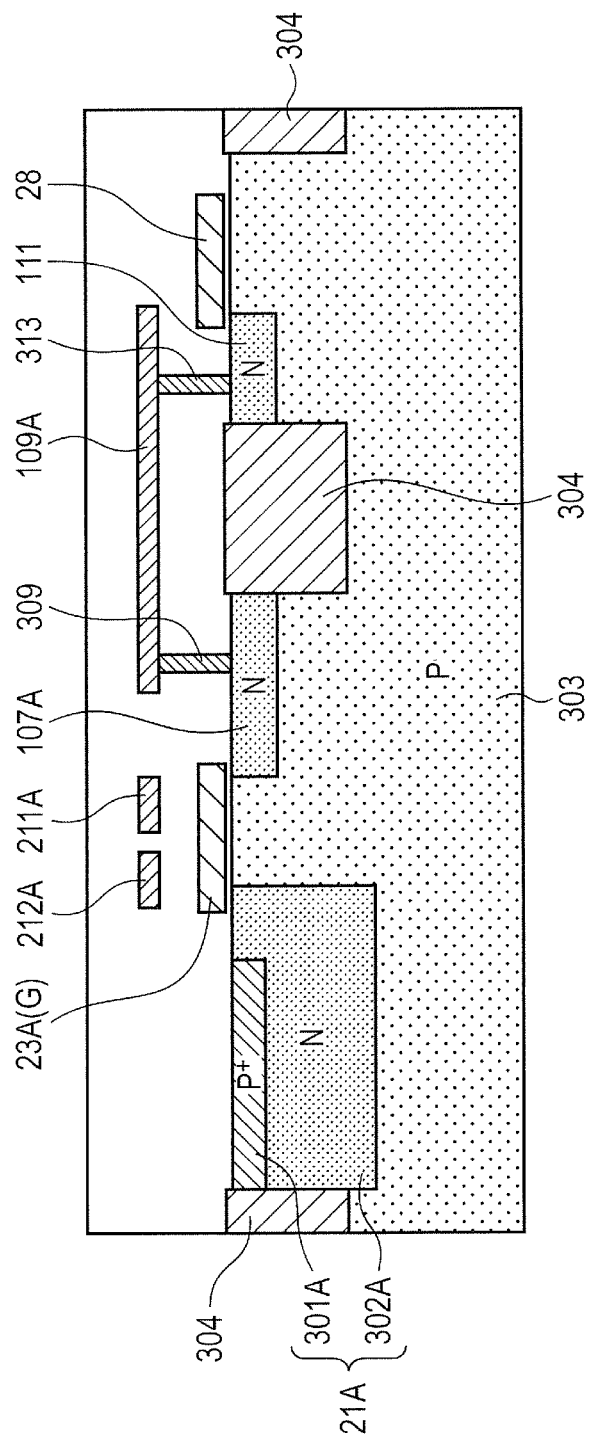
FIG. 12 is a sectional view of the pixel in the image pickup apparatus according to the third embodiment of the present invention.

An image pickup apparatus according to a third embodiment of the present invention is described with reference to FIG. 11 and FIG. 12. FIG. 11 is a plan view of a pixel in the image pickup apparatus according to this embodiment. FIG. 12 is a sectional view taken along the line 12-12 of FIG. 11. The configurations not shown in FIG. 11 and FIG. 12 are the same as those of the first embodiment, and hence the descriptions thereof are omitted. In this embodiment, in the third active region, an N-type semiconductor region (third floating diffusion region) 111 and a capacitance addition transistor 28 are further formed. The capacitance addition transistor 28 is a transistor configured to add a gate capacitance to an FD capacitance, and the FD capacitance can be controlled by supplying a voltage to the gate of the capacitance addition transistor 28.

In this embodiment, the conductive member 109A extends in parallel with the first drive wiring 211A while being opposed thereto and is electrically connected to the FD regions 107A and 108A through the contact plugs 309 and 310. The conductive member 109A is electrically connected to the N-type semiconductor region 111 through a contact plug 313, and the end portion of the conductive member 109A extends to the capacitance addition transistor 28 beyond the end portion of the N-type semiconductor region 111 in a plan view. The N-type semiconductor region 111 is electrically connected to the gate of the amplifying transistor 26 through a wiring layer (not shown).

In this embodiment, the end portion of the FD region 210 corresponds to a boundary between the N-type semiconductor region 111 in a region separate from the FD region 107A that is an N-type semiconductor region and the gate of the capacitance addition transistor 28, or corresponds to a boundary of pn-junction. The end portion of the FD region 210 may be defined in a boundary between the capacitance addition transistor 28 and the gate of the reset transistor 25 instead of being defined in the capacitance addition transistor 28. The configuration thereof is not limited as long as the conductive member 109A extends beyond the end portion of the FD region 210. The N-type semiconductor region 111 may be formed in the same active region as that of the FD region 107A.

In this embodiment, the parasitic capacitance between the gate 23A(G) of the first transfer transistor 23A and the first drive wiring 211A and between the gate 23A(G) of the first transfer transistor 23A and the FD region 210 can be increased, with the result that the effect of the first embodiment becomes more outstanding.

Fourth Embodiment

Figure 13:
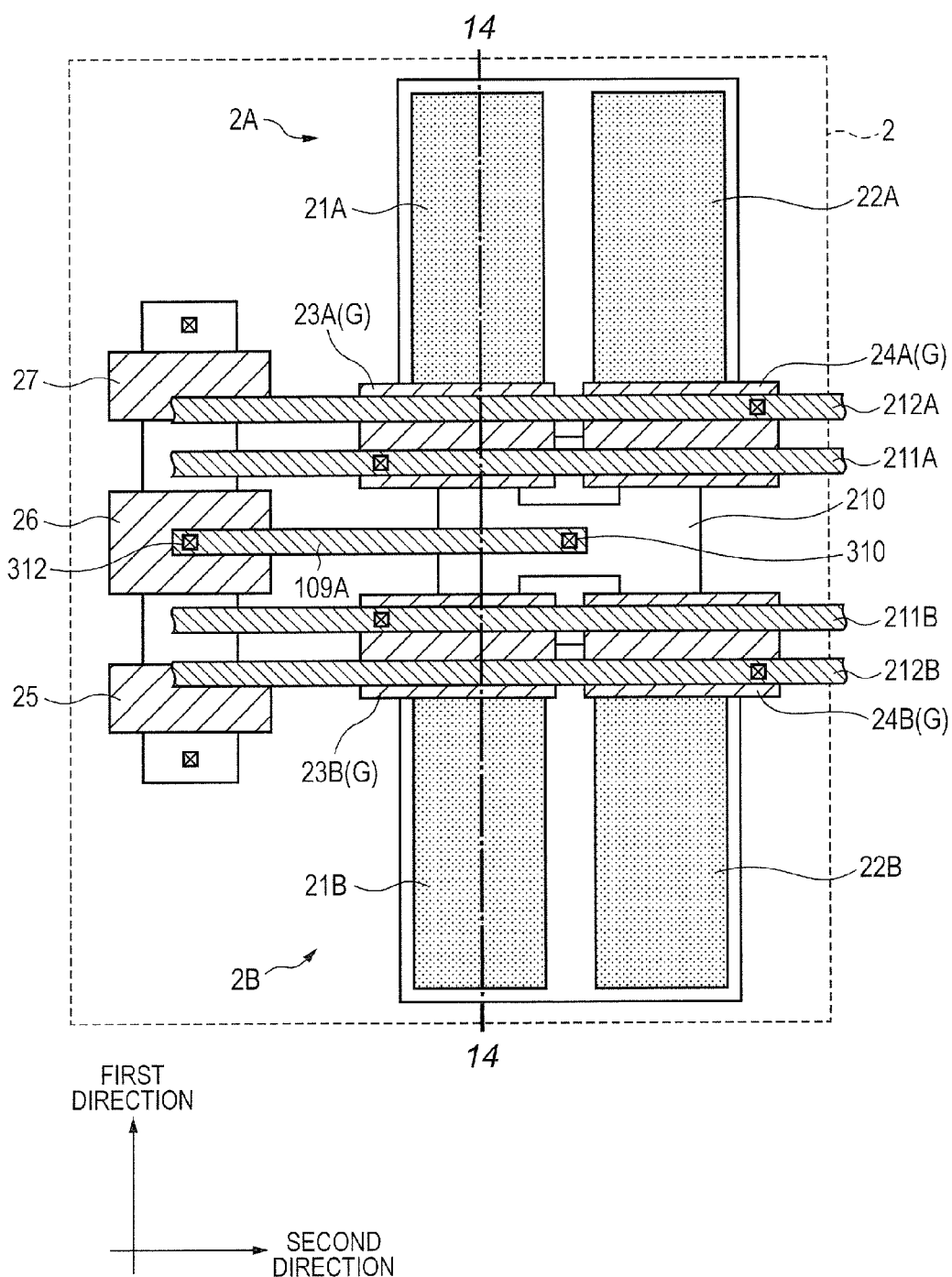
FIG. 13 is a plan view of a pixel in an image pickup apparatus according to a fourth embodiment of the present invention.
Figure 14:
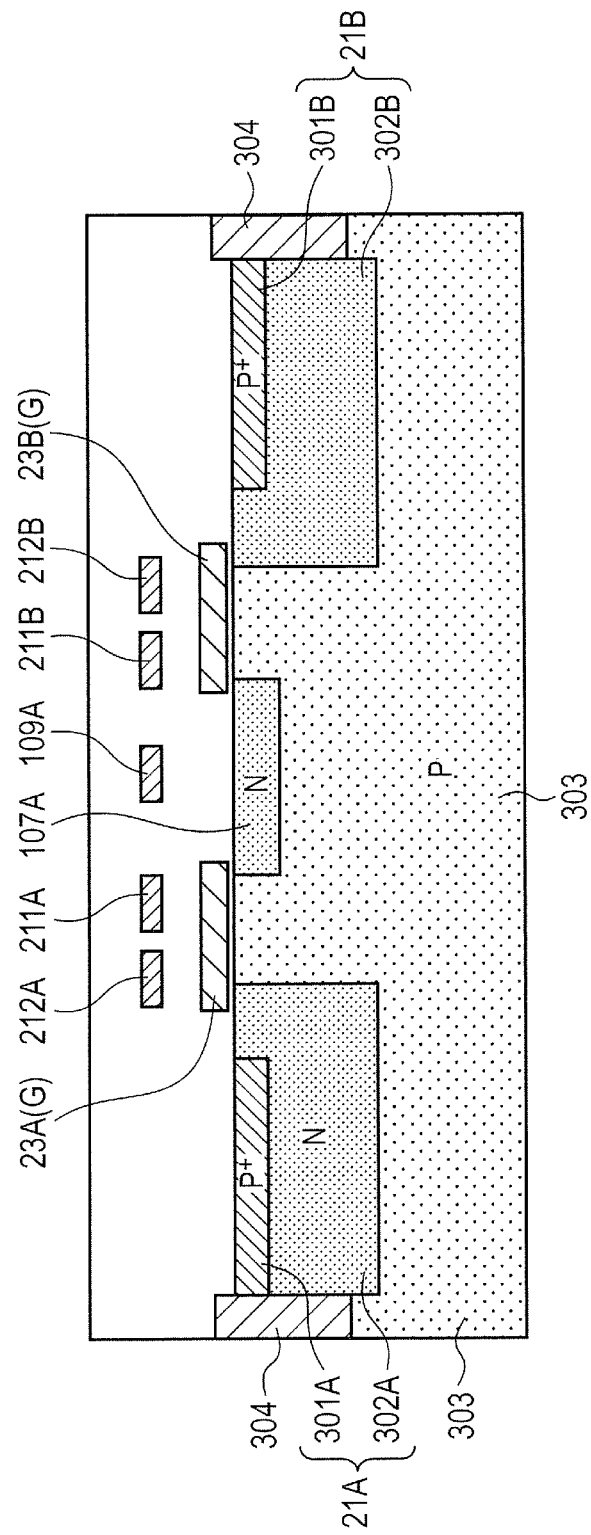
FIG. 14 is a sectional view of the pixel in the image pickup apparatus according to the fourth embodiment of the present invention.

An image pickup apparatus according to a fourth embodiment of the present invention is described with reference to FIG. 13 and FIG. 14. A circuit diagram of the image pickup apparatus according to this embodiment is the same as that illustrated in FIG. 2, and hence the configuration of the pixel is mainly described. FIG. 13 is a plan view of the pixel in the image pickup apparatus according to this embodiment. FIG. 14 is a sectional view taken along the line 14-14 of FIG. 13. In this embodiment, the first pixel 2A and the second pixel 2B that are adjacent to each other in the first direction are formed so as to be mirror-symmetrical to each other. Specifically, the third photoelectric conversion element 21B, the fourth photoelectric conversion element 22B, the gate 23B (G), and the gate 24B(G) are formed symmetrically to the first photoelectric conversion element 21A, the second photoelectric conversion element 22A, the gate 23A(G), and the gate 24(G) with respect to the FD region 210. The third drive wiring 211B and the fourth drive wiring 212B are formed symmetrically to the first drive wiring 211A and the second drive wiring 212A with respect to the FD region 210. The conductive member 109A is formed at an intermediate position between the drive wirings 211A and 211B and extends in parallel with the drive wirings 211A and 211B while being opposed thereto.

In the second pixel 2B, in the same way as in the first pixel 2A, a signal of the photoelectric conversion element 21B can be read as a signal for focus detection, and added signals of the photoelectric conversion elements 21B and 22B can be read as a signal for image pickup. The two pixels 2A and 2B share the amplifying transistor 26, and the charges of the photoelectric conversion elements 21A, 22A, 21B, and 22B can be added to be output. The signals from the photoelectric conversion elements 21A and 22A and the signals from the photoelectric conversion elements 21B and 22B can also be read as signals in different rows.

In this embodiment, the conductive member 109A is formed at an intermediate position between the drive wirings 211A and 211B. Thus, the parasitic capacitance between the conductive member 109A and the drive wiring 211A can be set to be substantially equal to that between the conductive member 109A and the drive wiring 211B. Therefore, the voltage of the FD region 210 when the charge of the first photoelectric conversion element 21A is transferred becomes substantially equal to that of the FD region 210 when the charge of the second photoelectric conversion element 21B is transferred. Specifically, amounts of signals respectively output from the first pixel 2A and the second pixel 2B can be made equal to each other.

Fifth Embodiment

An image pickup apparatus according to a fifth embodiment of the present invention is described with reference to FIG. 15. The configurations different from those of the first embodiment are mainly described below, and the descriptions of the same configurations as those of the first embodiment are omitted.

Figure 15:
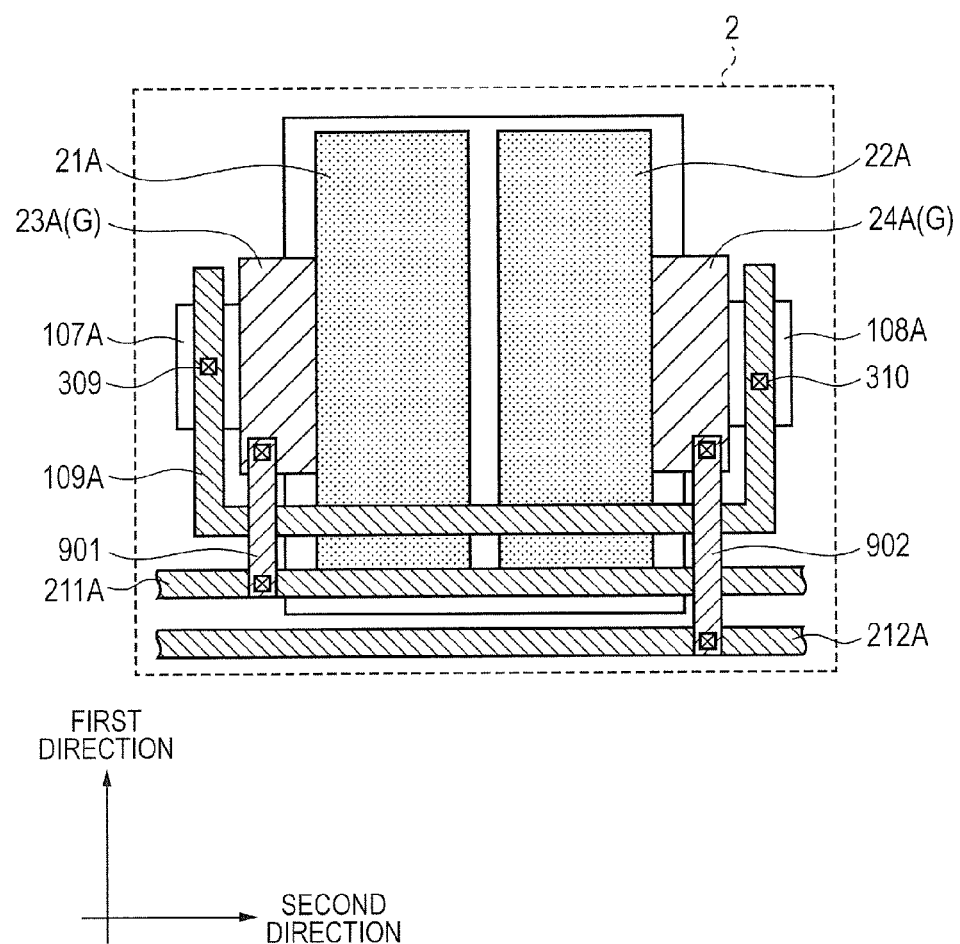
FIG. 15 is a plan view of a pixel in an image pickup apparatus according to a fifth embodiment of the present invention.

FIG. 15 is a plan view of a pixel in the image pickup apparatus according to this embodiment. In FIG. 15, members having the same functions as those of the members in FIG. 3 are denoted by the same reference symbols. In FIG. 15, the first FD region 107A, the gate 23A(G) of the first transfer transistor 23A, the first photoelectric conversion element 21A, the second photoelectric conversion element 22A, the gate 24A(G) of the second transfer transistor 24A, and the second FD region 108A are formed so as to be arranged in the stated order in the second direction. The first drive wiring 211A and the second drive wiring 212A extend in the second direction.

The gate 23A(G) and the first drive wiring 211A are electrically connected to each other through intermediation of a conductive member 901 that extends in the first direction. Similarly, the gate 24A(G) and the second drive wiring 212A are electrically connected to each other through intermediation of a conductive member 902 that extends in the first direction. The drive wirings 211A and 212A and the conductive member 109A are formed on a first wiring layer, and the conductive members 901 and 902 are formed on a second wiring layer on the first wiring layer. The conductive member 109A includes a center portion parallel to the drive wiring 211A and two end portions perpendicular to the drive wiring 211A. The two end portions of the conductive member 109A are electrically connected to the FD regions 107A and 108A respectively through the contact plugs 309 and 310. Further, the respective end portions of the conductive member 109A are close to the gates 23A(G) and 24A(G) of the transfer transistors 23A and 24A and extend beyond the end portions of the FD regions 107A and 108A. The conductive member 109A is electrically connected to the gate of the amplifying transistor 26 (not shown).

In this embodiment, in order to enhance mirror symmetry, the photoelectric conversion elements 21A and 22A are positioned between the two FD regions 107A and 108A. Thus, the length of the conductive member 109A included in the FD region 210 can be increased, and the parasitic capacitance between the gate 23A(G) of the first transfer transistor 23A and the first drive wiring 211A, and the FD region 210 can be increased, with the result that the effect of the first embodiment becomes more outstanding.

Sixth Embodiment

An image pickup apparatus according to a sixth embodiment of the present invention is described with reference to FIG. 16. The configurations different from those of the first embodiment are mainly described below, and the descriptions of the same configurations as those of the first embodiment are omitted.

Figure 16:
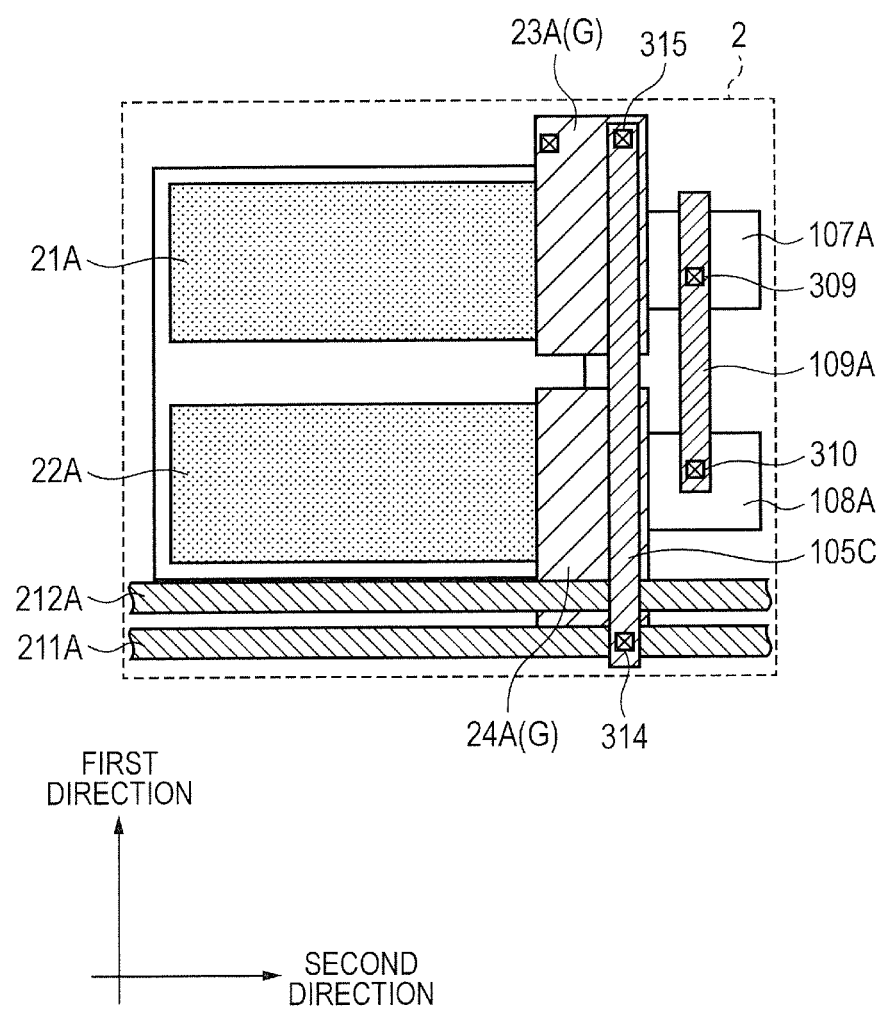
FIG. 16 is a plan view of a pixel in an image pickup apparatus according to a sixth embodiment of the present invention.

FIG. 16 is a plan view of a pixel in the image pickup apparatus according to this embodiment. In FIG. 16, members having the same functions as those of the members in FIG. 3 are denoted by the same reference symbols. In FIG. 16, the first photoelectric conversion element 21A, the gate 23A(G) of the first transfer transistor 23A, and the FD region 107A are formed so as to be arranged in the second direction. Similarly, the second photoelectric conversion element 22A, the gate 24A(G) of the second transfer transistor 24A, and the FD region 108A are formed so as to be arranged in the second direction.

Further, the drive wirings 211A and 212A are formed in the second direction. The drive wiring 212A is electrically connected to the gate 24A(G) of the second transfer transistor 24A through a contact plug (not shown). The drive wiring 211A is electrically connected to the gate 23A(G) of the first transfer transistor 23A through a connection wiring 105C. The connection wiring 105C is formed in a direction (first direction) perpendicular to a direction (second direction) in which the drive wiring 211A extends. Specifically, one end of the connection wiring 105C is electrically connected to the drive wiring 211A through a contact plug 314, and the other end of the connection wiring 105C is electrically connected to the gate 23A(G) of the first transfer transistor 23A through a contact plug 315.

The conductive member 109A is formed perpendicularly to the direction (second direction) in which the drive wiring 211A extends and in parallel with the direction (first direction) in which the connection wiring 105C extends. One end of the conductive member 109A is electrically connected to the FD region 107A through the contact plug 309 and extends beyond the end portion of the FD region 107A. The other end of the conductive member 109A is electrically connected to the FD region 108A through the contact plug 310. The conductive member 109A is formed in parallel with the connection wiring 105C, and one end of the conductive member 109A extends beyond the end portion of the FD region 107A. Therefore, the parasitic capacitance between the conductive member 109A and the connection wiring 105C can be increased, and the transfer efficiency of a charge can be enhanced. The parasitic capacitance may be further increased by causing the other end of the conductive member 109A to extend beyond the end portion of the FD region 108A.

In this embodiment, the drive wirings 211A and 212A and the conductive member 109A are formed on the same wiring layer. Therefore, the same effect as that of the first embodiment can be obtained without limiting the degree of freedom of the layout of other wiring layers.

Seventh Embodiment

Figure 17:
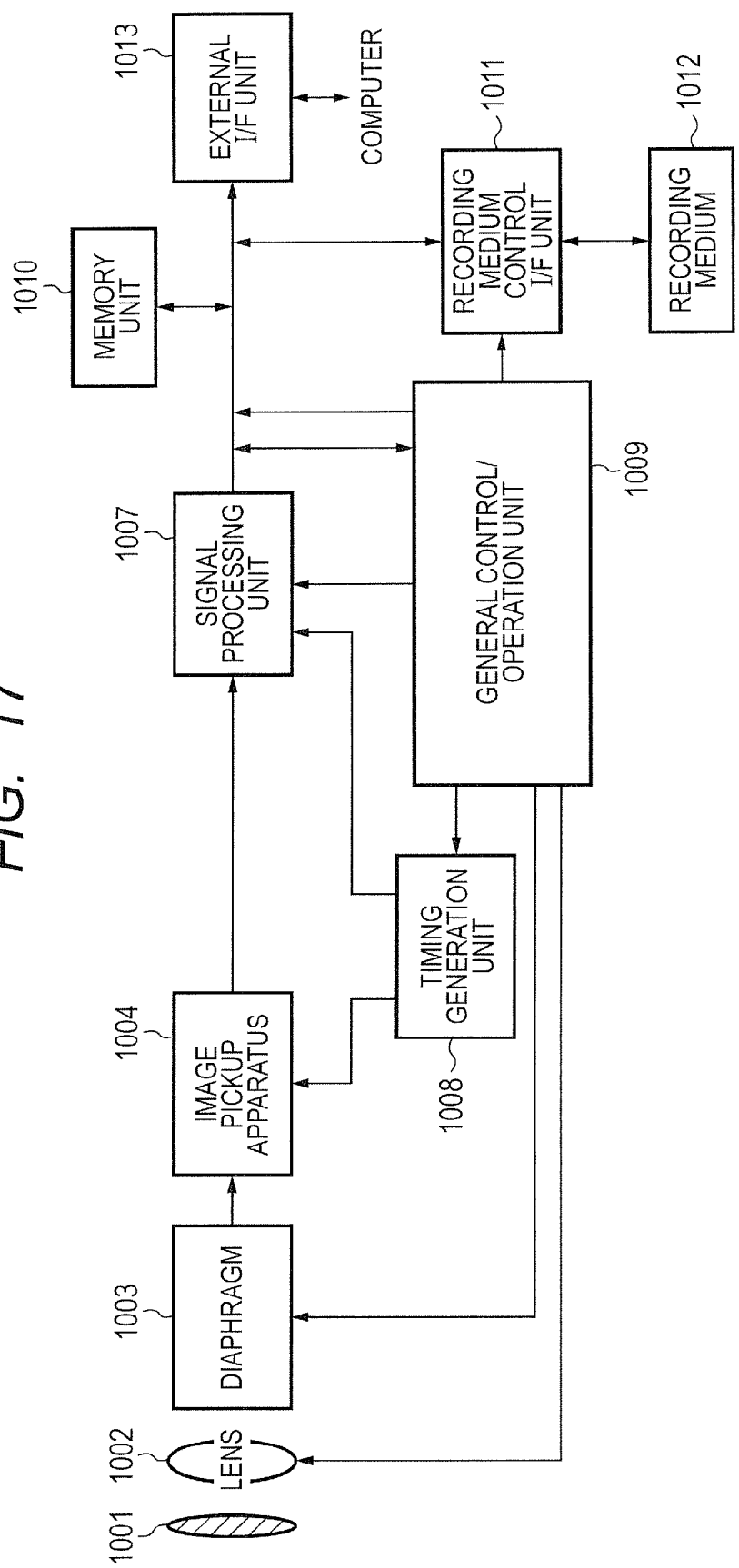
FIG. 17 is a block diagram of an image pickup system according to a seventh embodiment of the present invention.

An image pickup system according to a seventh embodiment of the present invention is described. As the image pickup system, there may be given a digital still camera, a digital camcorder, a copying machine, a facsimile machine, a mobile telephone, an in-vehicle camera, and an observation satellite. FIG. 17 is a block diagram of a digital still camera as an example of the image pickup system according to the seventh embodiment.

In FIG. 17, the image pickup system includes a barrier 1001 configured to protect a lens, a lens 1002 configured to form an optical image of a subject in an image pickup apparatus 1004, and a diaphragm 1003 configured to make the amount of light passing through the lens 1002 variable. The image pickup system further includes the image pickup apparatus 1004 described in the above-mentioned first to sixth embodiments, and the image pickup apparatus 1004 converts the optical image formed by the lens 1002 into image data. In this case, it is assumed that an AD converter is formed on a semiconductor substrate of the image pickup apparatus 1004. The image pickup system further includes a signal processing region 1007, a timing generation unit 1008, a general control/operation unit 1009, a memory unit 1010, a recording medium control I/F unit 1011, a recording medium 1012, and an external I/F unit 1013. The signal processing unit 1007 subjects the image pickup data output from the image pickup apparatus 1004 to various corrections and compression. The timing generation unit 1008 outputs various timing signals to the image pickup apparatus 1004 and the signal processing unit 1007. The general control/operation unit 1009 controls the entire digital still camera, and the memory unit 1010 serves as a frame memory for temporarily storing image data. The recording medium control I/F unit 1011 records or reads data with respect to a recording medium. The recording medium 1012 is formed of a removable semiconductor memory or the like and records or reads image pickup data. The external I/F unit 1013 is an interface for communicating to/from an external computer and the like. In this case, a timing signal and the like may be input from outside of the image pickup system, and it is sufficient that the image pickup system include at least the image pickup apparatus 1004 and the signal processing unit 1007 configured to process the image pickup signal output from the image pickup apparatus 1004.

In this embodiment, the configuration in which the image pickup apparatus 1004 and the AD converter are provided on separate semiconductor substrates is described. However, the image pickup apparatus 1004 and the AD converter may be formed on the same semiconductor substrate. The image pickup apparatus 1004 and the signal processing unit 1007 may be formed on the same semiconductor substrate.

The signal processing unit 1007 may be configured to process a signal based on the charge generated in the first photoelectric conversion element 21A and a signal based on the charge generated in the second photoelectric conversion element 22A, to thereby obtain information on a distance from the image pickup apparatus 1004 to the subject.

In the image pickup system according to this embodiment, the image pickup apparatus according to the first to sixth embodiments is used as the image pickup apparatus 1004. Thus, when the image pickup apparatus according to the present invention is applied to the image pickup system, the transfer efficiency of a charge can be enhanced, and an image pickup system of high image quality having a high S/N ratio can be realized.

Other Embodiments

In the foregoing, some embodiments to which the present invention can be applied are merely described. However, the present invention does not exclude the case where those embodiments are altered or modified appropriately without departing from the spirit of the present invention, and the configurations of the first to sixth embodiments may also be combined. Further, in the above-mentioned embodiments, the transistor forming the pixel is made of an N-channel MOS, but a P-channel MOS may also be used instead. Further, the photoelectric conversion element is not limited to the one that excites negative charges and may be the one that generates holes. In the case where the transfer transistor is made of a P-channel MOS, a high level and a low level of the drive pulse supplied to the gate of the transfer transistor may be reversed from those in the above-mentioned embodiments. In this case, the transfer efficiency of a charge can be improved by using the photoelectric conversion element that generates holes. Further, the number of the photoelectric conversion elements that share the amplifying transistor is not limited to the number in the above-mentioned embodiments, and any number of the photoelectric conversion elements may share the amplifying transistor. Further, the photoelectric conversion element may be formed on a back surface of a substrate, and a plurality of photoelectric conversion elements may be laminated to be formed as in an organic photoelectric conversion film.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-010964, filed Jan. 23, 2015, which is hereby incorporated by reference herein in its entirety.

What is claimed is:

1. An image pickup apparatus, comprising:
   a first photoelectric conversion element;
   a second photoelectric conversion element adjacent to the first photoelectric conversion element in a first direction;
   a third photoelectric conversion element adjacent to the first photoelectric conversion element in a second direction perpendicular to the first direction;
   a fourth photoelectric conversion element adjacent to the third photoelectric conversion element in the first direction, and adjacent to the second photoelectric conversion element in the second direction;
   a first, a second, a third and a fourth transfer transistors which are configured to transfer charges respectively from the first, the second, the third and the fourth photoelectric conversion elements to a floating diffusion region;

an amplifying transistor configured to output a signal corresponding to the charges in the floating diffusion region;

a first, a second, a third and a fourth drive wirings extending in the first direction, which are electrically connected to gates of the first, the second, the third and the fourth transfer transistors, respectively; and a conductive member, which is configured to electrically connect the floating diffusion region and a gate of the amplifying transistor to each other, and is configured to extend beyond an end portion of the floating diffusion region in a plan view while being opposed to the first drive wiring, wherein, in a plan view, a pair of the first photoelectric conversion element and the second photoelectric conversion element, and a pair of the third photoelectric conversion element and the fourth photoelectric conversion element are arranged in line symmetry, and wherein, in the plain view, a pair of the first drive wiring and the second drive wiring, and a pair of the third drive wiring and the fourth drive wiring are arranged in line symmetry.

2. An image pickup apparatus according to claim 1, wherein the conductive member is formed at a position closer to the first drive wiring than to the second drive wiring.

3. An image pickup apparatus according to claim 1, wherein a distance from the first drive wiring to the end portion of the floating diffusion region is shorter than a distance from the second drive wiring to the end portion of the floating diffusion region.

4. An image pickup apparatus according to claim 1, wherein the gate of the amplifying transistor is formed at a position closer to the first drive wiring than to the second drive wiring.

5. An image pickup apparatus according to claim 1, further comprising a connection wiring configured to electrically connect the first drive wiring and the gate of the first transfer transistor to each other, the connection wiring extending perpendicularly to the first drive wiring in the plan view, wherein the conductive member is formed so as to be opposed to the connection wiring.

6. An image pickup apparatus according to claim 1, further comprising a drive unit capable of performing a read mode of bringing the first transfer transistor into a conductive state by supplying a drive pulse to the first drive wiring and a read mode of bringing both the first transfer transistor and the second transfer transistor into a conductive state by supplying a drive pulse to the first drive wiring and the second drive wiring in parallel.

7. An image pickup apparatus according to claim 1, wherein a first microlens is formed on an upper side of the first photoelectric conversion element and the second photoelectric conversion element, and a second microlens is formed on an upper side of the third photoelectric conversion element and the fourth photoelectric conversion element.

8. An image pickup apparatus according to claim 1, wherein:

the pair of the first photoelectric conversion element and the second photoelectric conversion element, and the pair of the third photoelectric conversion element and the fourth photoelectric conversion element are arranged in line symmetry with respect to a first symmetry line, and the conductive member overlaps partially with the first symmetry line in the plan view.

9. An image pickup apparatus according to claim 1, wherein:

the pair of the first drive wiring and the second drive wiring, and the pair of the third drive wiring and the fourth drive wiring are arranged in line symmetry with respect to a second symmetry line, and the conductive member overlaps partially with the second symmetry line in the plan view.

10. An image pickup apparatus according to claim 1, further comprising:

a first micro-lens arranged correspondingly to the first photoelectric conversion element and the second photoelectric conversion element, and a second micro-lens arranged correspondingly to the third photoelectric conversion element and the fourth photoelectric conversion element.

11. An image pickup apparatus according to claim 1, wherein a signal read out from the first photoelectric conversion element or the second photoelectric conversion element is used for detecting a focus.

12. An image pickup system, comprising:

an image pickup apparatus; and a signal processing unit configured to process a signal output from the image pickup apparatus, the image pickup apparatus comprising:

a first photoelectric conversion element;

a second photoelectric conversion element adjacent to the first photoelectric conversion element in a first direction;

a third photoelectric conversion element adjacent to the first photoelectric conversion element in a second direction perpendicular to the first direction;

a fourth photoelectric conversion element adjacent to the third photoelectric conversion element in the first direction, and adjacent to the second photoelectric conversion element in the second direction;

a first, a second, a third and a fourth transfer transistors, which are configured to transfer charges respectively from the first, the second, the third and the fourth photoelectric conversion elements to a floating diffusion region;

an amplifying transistor configured to output a signal corresponding to the charges in the floating diffusion region;

a first, a second, a third and a fourth drive wirings extending in the first direction, which are electrically connected to gates of the first, the second, the third and the fourth transfer transistors, respectively; and a conductive member, which is configured to electrically connect the floating diffusion region and a gate of the amplifying transistor to each other, and is configured to extend beyond an end portion of the floating diffusion region in a plan view while being opposed to the first drive wiring, wherein, in a plan view, a pair of the first photoelectric conversion element and the second photoelectric conversion element, and a pair of the third photoelectric conversion element and the fourth photoelectric conversion element are arranged in line symmetry, and wherein, in the plan view, a pair of the first drive wiring and the second drive wiring, and a pair of the third drive wiring and the fourth drive wiring are arranged in line symmetry.

13. A method of driving an image pickup apparatus, the image pickup apparatus comprising:

a first photoelectric conversion element;
a second photoelectric conversion element adjacent to the first photoelectric conversion element in a first direction;
a third photoelectric conversion element adjacent to the first photoelectric conversion element in a second direction perpendicular to the first direction;
a fourth photoelectric conversion element adjacent to the third photoelectric conversion element in the first direction, and adjacent to the second photoelectric conversion element in the second direction;
a first, a second, a third and a fourth transfer transistors, which are configured to transfer charges respectively from the first, the second, the third and the fourth photoelectric conversion elements to a floating diffusion region;
an amplifying transistor configured to output a signal corresponding to the charges in the floating diffusion region;
a first, a second, a third and a fourth drive wirings extending in the first direction, which are electrically connected to gates of the first, the second, the third and the fourth transfer transistors; and
a conductive member, which is configured to electrically connect the floating diffusion region and a gate of the amplifying transistor to each other, and is configured to extend beyond an end portion of the floating diffusion region in a plan view while being opposed to the first drive wiring,
wherein, in a plan view, a pair of the first photoelectric conversion element and the second photoelectric conversion element, and a pair of the third photoelectric conversion element and the fourth photoelectric conversion element are arranged in line symmetry, and
wherein, in a plan view, a pair of the first drive wiring and the second drive wiring, and a pair of the third drive wiring and the fourth drive wiring are arranged in line symmetry,
the method comprising:
supplying a drive pulse to the first drive wiring and the second drive wiring in parallel to bring both the first transfer transistor and the second transfer transistor into a conductive state, to thereby read charges respectively from the first photoelectric conversion element and the second photoelectric conversion element in an added state; and
supplying a drive pulse to only the first drive wiring to bring the first transfer transistor into a conductive state, to thereby read the charge from the first photoelectric conversion element.

14. An image pickup apparatus, comprising:
a first photoelectric conversion element and a second photoelectric conversion element;
a first transfer transistor and a second transfer transistor, which are configured to transfer charges respectively from the first photoelectric conversion element and the second photoelectric conversion element when the first transfer transistor and the second transfer transistor are brought into conductive states, respectively;
a floating diffusion region configured to accumulate the charges transferred by the first transfer transistor and the second transfer transistor;
an amplifying transistor configured to output a signal corresponding to the charges transferred by the first transfer transistor and the second transfer transistor;
a first drive wiring and a second drive wiring, which are electrically connected to gates of the first transfer transistor and the second transfer transistor, respectively; and
a conductive member, which is configured to electrically connect the floating diffusion region and a gate of the amplifying transistor to each other, and is configured to extend beyond an end portion of the floating diffusion region in a plan view while being opposed to the first drive wiring;
a third photoelectric conversion element and a fourth photoelectric conversion element;
a third transfer transistor and a fourth transfer transistor, which are configured to transfer charges respectively from the third photoelectric conversion element and the fourth photoelectric conversion element to the floating diffusion region when the third transfer transistor and the fourth transfer transistor are brought into conductive states, respectively; and
a third drive wiring and a fourth drive wiring, which are electrically connected to gates of the third transfer transistor and the fourth transfer transistor, respectively,
wherein, in a plan view, the third photoelectric conversion element, the fourth photoelectric conversion element, the third transfer transistor, the fourth transfer transistor, the third drive wiring, and the fourth drive wiring are formed symmetrically to the first photoelectric conversion element, the second photoelectric conversion element, the first transfer transistor, the second transfer transistor, the first drive wiring, and the second drive wiring with respect to the floating diffusion region, and
wherein the conductive member is formed at an intermediate position between the first drive wiring and the third drive wiring.

15. An image pickup apparatus, comprising:
a first active region including a first photoelectric conversion element and a second photoelectric conversion element adjacent to the first photoelectric conversion element in a first direction;
a second active region including a third photoelectric conversion element adjacent to the first photoelectric conversion element in a second direction perpendicular to the first direction and a fourth photoelectric conversion elements adjacent to the third photoelectric conversion element in the first direction, and adjacent to the second photoelectric conversion element in the second direction;
a first, a second, a third and a fourth transfer transistors which are configured to transfer charges respectively from the first, the second, the third and the fourth photoelectric conversion elements to a floating diffusion region;
an amplifying transistor configured to output a signal corresponding to the charges in the floating diffusion region;
a first, a second, a third and a fourth drive wirings extending in the first direction, which are electrically connected to gates of the first, the second, the third and the fourth transfer transistors, respectively; and
a conductive member, which is configured to electrically connect the floating diffusion region and a gate of the amplifying transistor to each other, and is configured to extend beyond an end portion of the floating diffusion region in a plan view while being opposed to the first drive wiring, wherein the first active region and the second active region are arranged in line symmetry in a plan view.

16. An image pickup apparatus according to claim 15, wherein:
   the first active region and the second active region are arranged in line symmetry with respect to a first symmetry line, and
   the conductive member overlaps partially with the first symmetry line in the plan view.

17. An image pickup apparatus according to claim 15, wherein the pair of the first drive wiring and the second drive wiring, and the pair of the third drive wiring and the fourth drive wiring are arranged in line symmetry.

18. An image pickup apparatus according to claim 15, wherein:
   the pair of the first drive wiring and the second drive wiring, and the pair of the third drive wiring and the fourth drive wiring are arranged in line symmetry with respect to a second symmetry line, and
   the conductive member overlaps partially with the second symmetry line in the plan view.

19. An image pickup apparatus according to claim 15, further comprising:
   a first micro-lens arranged correspondingly to the first photoelectric conversion element and the second photoelectric conversion element, and
   a second micro-lens arranged correspondingly to the third photoelectric conversion element and the fourth photoelectric conversion element.

* * * * *